(12) United States Patent
Seo

(10) Patent No.: US 8,487,629 B2
(45) Date of Patent: Jul. 16, 2013

(54) BATTERY SYSTEM, ELECTRIC VEHICLE, AND BATTERY CONTROL APPARATUS

(75) Inventor: Kazuhiro Seo, Hirakata (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 566 days.

(21) Appl. No.: 12/732,475

(22) Filed: Mar. 26, 2010

(65) Prior Publication Data

US 2010/0253357 A1    Oct. 7, 2010

(30) Foreign Application Priority Data

Apr. 3, 2009  (JP) .................................. 2009-090866
Feb. 10, 2010  (JP) .................................. 2010-027118

(51) Int. Cl.
*G01N 27/416*    (2006.01)
(52) U.S. Cl.
USPC ............................................................... 324/427
(58) Field of Classification Search
USPC ..................................................... 341/120, 155–156
See application file for complete search history.

(56) References Cited

U.S. PATENT DOCUMENTS

| | | | | |
|---|---|---|---|---|
| 6,222,346 B1 * | 4/2001 | Mori | ............................. | 320/134 |
| 6,396,426 B1 * | 5/2002 | Balard et al. | .................. | 341/120 |
| 6,919,707 B2 * | 7/2005 | Kawai et al. | .................. | 320/117 |

FOREIGN PATENT DOCUMENTS

| | | |
|---|---|---|
| JP | 08303292 | 11/1996 |
| JP | 10209864 | 8/1998 |

OTHER PUBLICATIONS

Flash ADC, available on Feb. 19, 2008 at http://en.wikipedia.org/wiki/Flash_ADC.*

* cited by examiner

*Primary Examiner* — Melissa Koval
*Assistant Examiner* — Daniel Miller
(74) *Attorney, Agent, or Firm* — NDQ&M Watchstone LLP

(57) ABSTRACT

A battery system has: a voltage detection apparatus including a voltage detection portion which includes an AD converter which converts an analog voltage signal having a measurement target analog voltage into a digital voltage signal to output the digital voltage signal, a voltage level discrimination portion which is connected to a voltage detection line across which the analog voltage signal is delivered, and which discriminates the voltage level of the measurement target analog voltage to output a discrimination result, and a fault detection portion which detects, based on the output of the AD converter and the output of the voltage level discrimination portion, a fault in the voltage detection portion in a state in which the voltage value of the digital voltage signal is within a predetermined voltage range; a battery as a voltage source of the measurement target analog voltage; and a control portion which, when the fault detection portion detects the fault, limits the discharging of the battery, or limits the charging of the battery, or limits the discharging and charging of the battery.

11 Claims, 19 Drawing Sheets

FIG.3

| FAULT LOCATION | FAULT FACTOR |
|---|---|
| 1. AD CONVERTER | ABNORMAL ACCURACY OF INL, DNL |
| 2. REFERENCE VOLTAGE ($Vref_{AD}$) FOR AD CONVERSION | ABNORMAL ACCURACY OF REFERENCE VOLTAGE |
| 3. AD FRONT STAGE PORTION | ABNORMAL OFFSET VOLTAGE, ABNORMAL LEAKAGE CURRENT |
| 4. PROTECTION CIRCUIT | ABNORMAL RESISTANCE IN PROTECTIVE RESISTOR, ABNORMAL LEAKAGE CURRENT IN ANTI-SURGE DEVICE |
| 5. VOLTAGE INPUT SWITCHING PORTION | ABNORMAL ON-STATE RESISTANCE IN SWITCH PORTION, ABNORMAL LEAKAGE CURRENT IN SWITCH PORTION |

BATTERY SYSTEM, ELECTRIC VEHICLE, AND BATTERY CONTROL APPARATUS

This nonprovisional application claims priority under 35 U.S.C. §119(a) on Patent Application No. 2009-090866 filed in Japan on Apr. 3, 2009 and Patent Application No. 2010-027118 filed in Japan on Feb. 10, 2010, the entire contents of both of which are hereby incorporated by reference.

BACKGROUND OF THE INVENTION

1. Field of the Invention

The present invention relates to a battery system and a battery control apparatus provided with a function of detecting a voltage value of a battery, and more particularly to a battery system and a battery control apparatus provided with a function of detecting such a fault as leads to abnormal detection of a voltage value. The present invention also relates to an electric vehicle employing such a battery system.

2. Description of Related Art

With a voltage detection apparatus that detects an analog voltage of a measurement target by use an AD (analog-to-digital) converter, breakage of the signal line across which the analog voltage is delivered, or failure of the AD converter itself, results in abnormal detection of the analog voltage (makes accurate detection of the analog voltage impossible). On the other hand, with such a voltage detection apparatus, it is often the case that the range of voltage which the measurement target analog voltage normally is in is previously known.

Accordingly, so long as the output voltage value of the AD converter is an abnormally high, or abnormally low, voltage value that the measurement target analog voltage cannot take (that is, not within the above-mentioned range of voltage), it is easy to detect some abnormality or other. There are also, however, minor faults in which the output voltage value of the AD converter is within the above-mentioned range of voltage indeed but does not satisfy the expected detection accuracy. Such faults are called in-range faults.

For example, in a case where the measurement target is a lithium-ion secondary battery, it is common to adopt, for example, about 4.0 V (volts) and about 2.0 V as the voltage values indicating overcharging and overdischarging, respectively, of the lithium-ion secondary battery. Accordingly, if the output voltage value of the AD converter is over 4.0 V or below 2.0 V, it is possible to detect overcharging or overdischarging, each a kind of abnormality. However, when the actual voltage value of the measurement target is 3.6V, if due to abnormal accuracy of the AD converter the output voltage value of the AD converter is 3.3V, the control system will recognize the voltage value of the measurement target to be 3.3V. Causing erroneous detection of 3.3 V despite its actually being 3.6 V, such abnormal accuracy is a kind of in-range fault.

FIG. 13 is an overall block diagram of a voltage detection apparatus 900 which contributes to detection of an in-range fault as discussed above. FIG. 14 is a block diagram of part of the voltage detection apparatus 900, including an equivalent circuit diagram of a voltage input switching portion 911. In the voltage detection apparatus 900, a voltage detection line 910 across which an analog voltage of a measurement target is delivered is connected to a first input terminal of a voltage input switching portion 911 comprising a multiplexer or the like, and a reference voltage having a previously known reference voltage value is fed to a second input terminal of the voltage input switching portion 911. The voltage input switching portion 911 performs selection operation such that the analog voltage of the measurement target and the reference voltage are fed to an AD converter 912 on a time-division basis. Based on the difference between the output voltage value of the AD converter 912, as observed when the reference voltage is being fed to the AD converter 912, and the reference voltage value, a comparator 913 can detect whether or not an in-range fault is present. Specifically, if the absolute value of the difference is equal to or greater than a predetermined threshold value (for example, 10 mV), the comparator 913 recognizes an in-range fault to be present.

According to another conventionally disclosed method, a measurement value obtained through conversion by an AD converter is compared with a signal having a predetermined signal level introduced from the measurement value, and if a deviation exceeding a permissible range is detected between those signal values, a faulty state within the range for detecting the measurement value is recognized.

Inconveniently, however, with the circuit configuration of the voltage detection apparatus 900, if an abnormality is present in a switch portion 920 provided within the voltage input switching portion 911, hence between the voltage detection line 910 and the AD converter 912, it cannot be detected. For example, if the on-state resistance in the switch portion 920 is abnormally high, or the leakage current in the switch portion 920 is abnormally high, although the voltage value of the measurement target is detected to be slightly lower than it truly is, since the result of AD conversion of the reference voltage is not affected by the switch portion 920, an in-range fault associated with the switch portion 920 cannot be detected.

With a view to protecting the measurement target such as a lithium-ion secondary battery from short-circuiting, and protecting the voltage detection apparatus from surges, it is also common to provide a protection circuit including a protective resistor or an anti-surge device between the voltage detection line 910 and the measurement target. With the circuit configuration of the voltage detection apparatus 900, however, a fault in such a protection circuit (for example, an abnormal resistance value in the protective resistor, or an abnormal leakage current in the anti-surge device) cannot be detected either.

On the other hand, in a case where the measurement target is a secondary battery or the like, on detection of an in-range fault it is necessary to cope with it in some way or other. No technology, however, has been proposed yet that achieves satisfactory detection of an in-range fault and that in addition can cope with one appropriately on its occurrence. Incidentally, the above-mentioned "method of detecting a faulty state within the range for detecting the measurement value" is intended for detection of the position of a mechanical member such as a gas pedal (accelerator) of an automobile, and is not technology useful in a case where the measurement target is a secondary battery or the like.

SUMMARY OF THE INVENTION

According to one aspect of the invention, a battery system is provided with: a voltage detection apparatus including a voltage detection portion which includes an AD converter which converts an analog voltage signal having a measurement target analog voltage into a digital voltage signal to output the digital voltage signal, a voltage level discrimination portion which is connected to a voltage detection line across which the analog voltage signal is delivered, and which discriminates the voltage level of the measurement target analog voltage to output a discrimination result, and a fault detection portion which detects, based on the output of the AD converter and the output of the voltage level discrimination portion, a fault in the voltage detection portion in a state in which the voltage value of the digital voltage signal is within a predetermined voltage range; a battery as a voltage source of the measurement target analog voltage; and a control portion which, when the fault detection portion detects the fault, limits the discharging of the battery, or limits the charging of the battery, or limits the discharging and charging of the battery.

According to another aspect of the invention, a battery system is provided with: a voltage detection apparatus including a voltage detection portion which includes an AD converter which converts an analog voltage signal having a measurement target analog voltage supposed to be within a predetermined voltage range into a digital voltage signal to output the digital voltage signal, a voltage level discrimination portion which is connected to a voltage detection line across which the analog voltage signal is delivered, and which discriminates the voltage level of the measurement target analog voltage within the predetermined voltage range to output a discrimination result, and a fault detection portion which detects, based on the output of the AD converter and the output of the voltage level discrimination portion, a fault in the voltage detection portion in a state in which the voltage value of the digital voltage signal is within the predetermined voltage range; a battery as a voltage source of the measurement target analog voltage; and a control portion which, when the fault detection portion detects the fault, limits the discharging of the battery, or limits the charging of the battery, or limits the discharging and charging of the battery.

Specifically, for example, the battery is a chargeable and dischargeable battery, and when the fault detection portion detects the fault, the control portion inhibits the charging of the battery but permits the discharging of the battery.

More specifically, when the fault detection portion detects the fault, the control portion controls the discharging of the battery by using, as the output voltage value of the battery, the smaller of a voltage value based on the output of the AD converter and a voltage value based on the output of the voltage level discrimination portion.

Specifically, for another example, the voltage level discrimination portion includes comparators which compare the measurement target analog voltage with predetermined reference voltages within the predetermined voltage range, and to detect the fault in the voltage detection portion in the state in which the voltage value of the digital voltage signal is within the predetermined voltage range, the fault detection portion compares the output of the AD converter and the output of the voltage level discrimination portion at the moment that an output of the comparators changes.

Specifically, for another example, a branch point from which the analog voltage signal is fed separately to the AD converter and to the voltage level discrimination portion is provided on the voltage detection line, the voltage detection portion includes an additional circuit portion provided between the branch point and the AD converter, and the target of the fault detection by the fault detection portion includes not only the AD converter but also the additional circuit portion.

Specifically, for another example, the measurement target analog voltage includes a plurality of measurement target analog voltages, the voltage detection portion further includes a voltage input switching portion which feeds the AD converter with one at a time of a plurality of analog voltage signals representing the plurality of measurement target analog voltages respectively, the AD converter converts the analog voltage signals fed sequentially from the voltage input switching portion into digital voltage signals to output the digital voltage signals, the voltage level discrimination portion is connected to a plurality of voltage detection lines across which the plurality of analog voltage signals are delivered, and discriminates the voltage levels of the corresponding measurement target analog voltages within the predetermined voltage range to output discrimination results, and the fault detection portion detects, based on the output of the AD converter and the output of the voltage level discrimination portion, a fault in the voltage detection portion in a state in which the voltage values of the digital voltage signals are within the predetermined voltage range.

In this case, for example, the voltage level discrimination portion includes comparators which compare the measurement target analog voltages with predetermined reference voltages within the predetermined voltage range, and to detect the fault in the voltage detection portion in the state in which the voltage values of the digital voltage signals are within the predetermined voltage range, the fault detection portion compares the output of the AD converter and the output of the voltage level discrimination portion at the moment that an output of the comparators changes.

In addition, for example, branch points from which the plurality of analog voltage signals are respectively fed separately to the AD converter and to the voltage level discrimination portion are provided on the voltage detection lines, the voltage detection portion includes an additional circuit portion provided between the branch points and the AD converter, the voltage input switching portion is included in the additional circuit portion, and the target of the fault detection by the fault detection portion includes not only the AD converter but also the additional circuit portion.

Specifically, for another example, a branch point from which the analog voltage signal is fed separately to the AD converter and to the voltage level discrimination portion is provided on the voltage detection line, and a current restricting device which restricts the current flow across the wiring between the battery and the branch point is provided in the wiring.

Specifically, for another example, branch points from which the plurality of analog voltage signals are respectively fed separately to the AD converter and to the voltage level discrimination portion are provided on the voltage detection lines, and current restricting devices which, one for each of a plurality of batteries as voltage sources of the plurality of measurement target analog voltages, restrict the current flow across the wiring between the batteries and the branch points are provided in the wiring.

According to yet another aspect of the invention, an electric vehicle is provided with the battery system described above and travels by using the battery in the battery system as a driving source.

The electric vehicle may be one that travels by using as a driving source not only the battery within the battery system but also an energy source other than a battery.

According to yet another aspect of the invention, the electric vehicle is further provided with a cruising control portion which controls the traveling of the electric vehicle by use of the voltage detection apparatus within the battery system, in which case, when the fault detection portion within the battery system detects the fault in the voltage detection portion, the cruising control portion controls the traveling of the electric vehicle by using, as the output voltage value of the battery, the smaller of a voltage value based on the output of the AD converter and a voltage value based on the output of the voltage level discrimination portion.

According to still another aspect of the invention, a battery control apparatus is provided with: a voltage detection apparatus including a voltage detection portion which includes an AD converter which converts an analog voltage signal having a measurement target analog voltage into a digital voltage signal to output the digital voltage signal, a voltage level discrimination portion which is connected to a voltage detection line across which the analog voltage signal is delivered, and which discriminates the voltage level of the measurement target analog voltage to output a discrimination result, and a fault detection portion which detects, based on the output of the AD converter and the output of the voltage level discrimination portion, a fault in the voltage detection portion in a state in which the voltage value of the digital voltage signal is within a predetermined voltage range; and a control portion which, when the fault detection portion detects the fault, limits the discharging of a battery as a voltage source of the measurement target analog voltage, or limits the charging of the battery, or limits the discharging and charging of the battery.

According to still another aspect of the invention, a battery control apparatus is provided with: a voltage detection apparatus including a voltage detection portion which includes an AD converter which converts an analog voltage signal having a measurement target analog voltage supposed to be within a predetermined voltage range into a digital voltage signal to output the digital voltage signal, a voltage level discrimination portion which is connected to a voltage detection line across which the analog voltage signal is delivered, and which discriminates the voltage level of the measurement target analog voltage within the predetermined voltage range to output a discrimination result, and a fault detection portion which detects, based on the output of the AD converter and the output of the voltage level discrimination portion, a fault in the voltage detection portion in a state in which the voltage value of the digital voltage signal is within a predetermined voltage range; and a control portion which, when the fault detection portion detects the fault, limits the discharging of a battery as a voltage source of the measurement target analog voltage, or limits the charging of the battery, or limits the discharging and charging of the battery.

The significance and benefits of the invention will be clear from the following description of its embodiments. It should however be understood that these embodiments are merely examples of how the invention is implemented, and that the meanings of the terms used to describe the invention and its features are not limited to the specific ones in which they are used in the description of the embodiments.

BRIEF DESCRIPTION OF THE DRAWINGS

FIG. 3 is a diagram enumerating fault locations and fault factors of in-range faults;

DETAILED DESCRIPTION OF PREFERRED EMBODIMENTS

Embodiments of the present invention will be described below specifically with reference to the accompanying drawings. Among different drawings referred to in the course of description, the same parts are identified by the same reference signs, and in principle no overlapping description of the same parts will be repeated. Presented below will be Embodiments 1 to 8, and unless inconsistent, any feature mentioned with regard to one embodiment applies to any other as well.

Embodiment 1

A voltage detection apparatus according to a first embodiment (Embodiment 1) of the invention will now be described. In Embodiment 1, it is assumed that there is one target of voltage measurement, and that the voltage detection apparatus is not provided with a protection circuit for protecting the measurement target from short-circuiting and the like.

Figure 1:
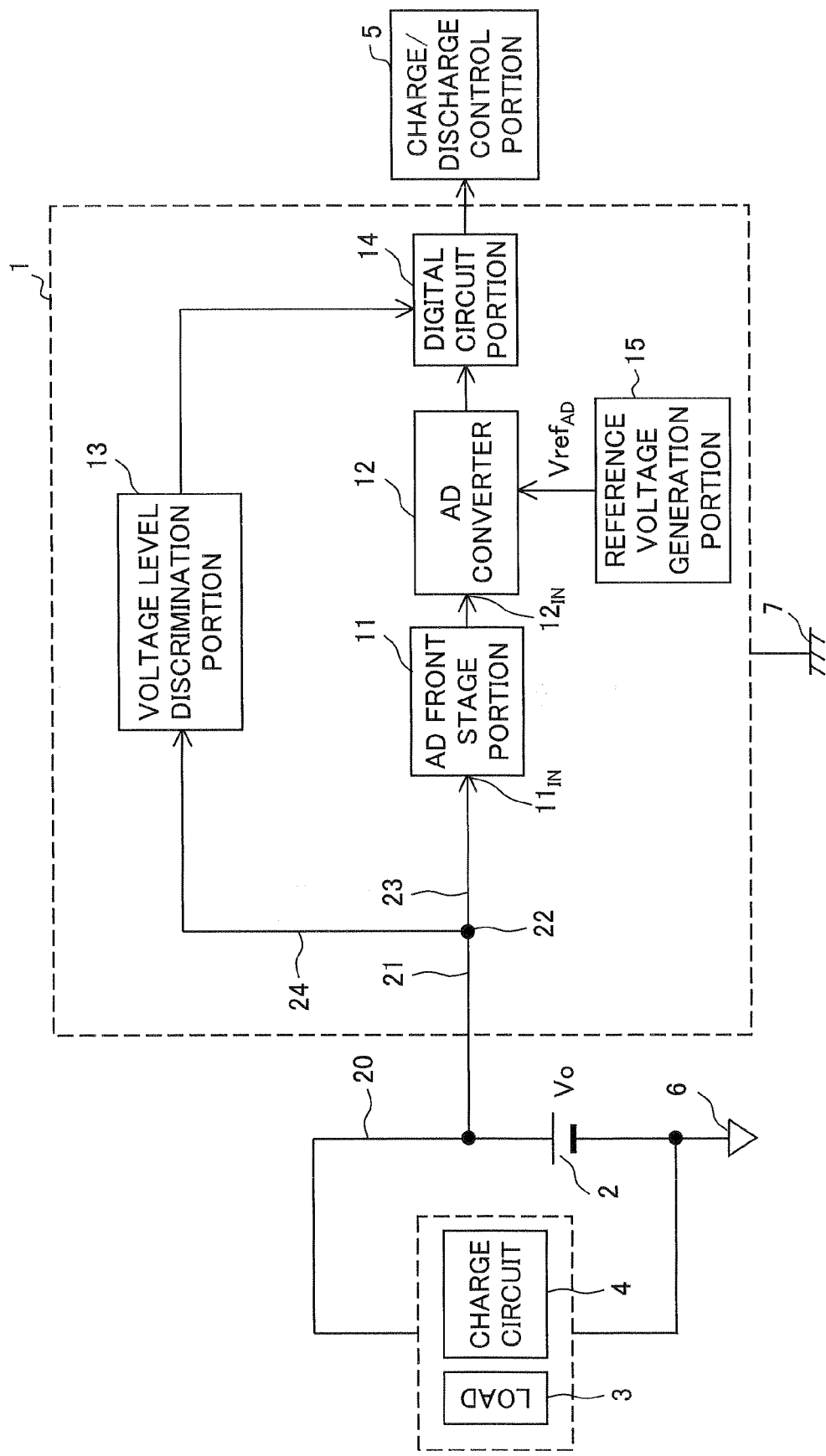
FIG. 1 is a block diagram of a voltage detection apparatus and blocks accompanying it according to Embodiment 1 of the invention.

FIG. 1 is an internal block diagram of the voltage detection apparatus 1 according to Embodiment 1. In FIG. 1 are also shown elements that are external to, and are connected to, the voltage detection apparatus 1. The voltage detection apparatus 1 is provided with blocks identified by the reference signs 11 to 15. In FIG. 1, the reference sign 2 represents a voltage source as a target of voltage measurement. In this embodiment, and in the other, later-described embodiments as well, unless otherwise stated, it is assumed that the measurement target is a rechargeable (chargeable and dischargeable) lithium-ion secondary battery (hereinafter abbreviated to LIB).

The reference sign 3 represents a load driven with the output voltage of the voltage source 2. The reference sign 4 represents a charge circuit for charging the voltage source 2. The reference sign 5 represents a charge/discharge control portion for controlling the charging of the voltage source 2 by use of the charge circuit 4 and the discharging of the voltage source 2 for the load 3 (that is, the output of electric power from the voltage source 2 to the load 3). The output voltage of the voltage source 2 will be referred to by the symbol Vo wherever convenient.

The voltage source 2, on one hand, and the load 3 and the charge circuit 4, on the other hand, are connected together by a loop-shaped main power line 20, off which a voltage detection line 21 branches to be connected to a positive output terminal of the voltage source 2. A negative output terminal of the voltage source 2 is connected to a reference potential point 6. The blocks identified by the reference signs 11 to 15 all operate relative to the potential at the reference potential point 7.

From an analog voltage signal on the voltage detection line 21, the voltage detection apparatus 1 detects the voltage between the positive and negative output terminals of the voltage source 2 (that is, the output voltage Vo of the voltage source 2). The voltage detection line 21 branches into two of them at a branch point 22, one being connected to an AD front stage portion 11 and the other being connected to a voltage level discrimination portion 13. The voltage detection line leading from the branch point 22 to the AD front stage portion 11 will be identified by the reference sign 23, and the voltage detection line leading from the branch point 22 to the voltage level discrimination portion 13 will be identified by the reference sign 24. Thus, the analog voltage signal representing the output voltage Vo of the voltage source 2 first passes across the voltage detection line 21, then branches off the voltage detection line 21 at the branch point 22, and then continues to pass across the voltage detection lines 23 and 24.

Figure 2:
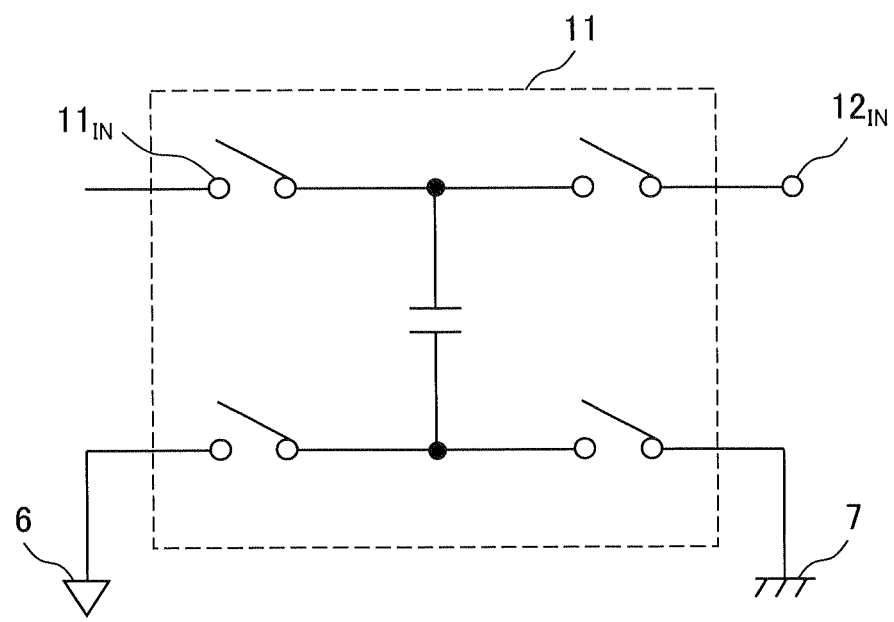
FIG. 2 is a diagram showing an example of the internal circuit of the AD front stage portion in FIG. 1.

The AD front stage portion 11 is a buffer circuit for delivering the analog voltage that reaches an input terminal $11_{IN}$ of the AD front stage portion 11 itself to an input terminal $12_{IN}$ of an AD converter 12. The AD front stage portion 11 comprises, for example, a differential amplifier, or a flying capacitor having a circuit configuration as shown in FIG. 2. The voltage delivered from the AD front stage portion 11 to the input terminal $12_{IN}$ is a voltage relative to the potential at a reference potential point 7, whereas the analog voltage delivered to the input terminal $11_{IN}$ is a voltage relative to the potential at the reference potential point 6. The potentials at the reference potential points 6 and 7 may be equal or different; here, however, for the sake of simple description, it is assumed that the two potentials are equal. In this case, the analog voltage delivered to the input terminal $11_{IN}$ is the voltage on the voltage detection line 23 relative to the potential at the reference potential points 6 and 7. Using a differential amplifier or a flying capacitor as the AD front stage portion 11 eliminates the need to make the two potentials equal.

Relative to a reference voltage $Vref_{AD}$ generated by a reference voltage generation portion 15, the AD converter 12 periodically converts the analog voltage signal at the input terminal $12_{IN}$ into a digital voltage signal, and outputs the resulting digital voltage signal to a digital circuit portion 14. The voltage detection apparatus 1 previously knows the voltage value of the reference voltage $Vref_{AD}$. Based on the analog voltage signal on the voltage detection line 24, the voltage level discrimination portion 13 discriminates the voltage level of the output voltage Vo of the voltage source 2. Specifically, the voltage level discrimination portion 13 discriminates which of a plurality of different voltage ranges the voltage value of the output voltage Vo of the voltage source 2 is in (see FIG. 4). Put in yet another way, the voltage level discrimination portion 13 detects the output voltage Vo of the voltage source 2 at a resolution coarser than the voltage detection resolution of the AD converter 12. A digital signal representing the result of the discrimination by the voltage level discrimination portion 13 is fed to the digital circuit portion 14. The output voltage value of the voltage source 2 as discriminated by the voltage level discrimination portion 13 will be referred to also as the discriminated voltage value.

The digital circuit portion 14 has a function as a fault detection portion; based on the output signals of the AD converter 12 and the voltage level discrimination portion 13, the digital circuit portion 14 detects whether or not the LIB as the voltage source 2 is in an overcharged or overdischarged state, and also detects whether or not an in-range fault is present.

With respect to the output voltage Vo of the voltage source 2 (and of each of the voltage sources 2[1] to 2[n] described later), a normal voltage range is previously defined. In normal use, the output voltage Vo of the voltage source 2 (and of each of the voltage sources 2[1] to 2[n] described later) is supposed to be within the normal voltage range. As described above, it is here assumed that the target of voltage measurement is a LIB. Accordingly, in the practical numerical example taken up here, it is assumed that the normal voltage range is 2 V or more but 4.0 V or less. The state in which the output voltage Vo of the voltage source 2 is 2 V or more but 4.0 V or less will be called the normal use state. The state in which the output voltage Vo of the voltage source 2 is over 4V, which is the upper limit of the normal voltage range, is the state in which the voltage source 2 is being overcharged (the voltage source 2 is said to be in the overcharged state); the state in which the output voltage Vo of the voltage source 2 is below 2V, which is the lower limit of the normal voltage range, is the state in which the voltage source 2 is being overdischarged (the voltage source 2 is said to be in the overdischarged state).

In this embodiment, and in the other, later-described embodiments as well, an in-range fault denotes a minor fault in which the output voltage of the voltage source 2 (or of any of the voltage sources 2[1] to 2[n] described later) is within the normal voltage range indeed but the detected voltage value Vdet of the voltage source 2 based on the output signal of the AD converter 12, does not satisfy the expected detection accuracy. For example, in a case where the absolute value of the permissible detection error is 10 mV or less and in addition the true output voltage Vo of the voltage source 2 is 3.600 V, if the inequality "3.590≦Vdet≦3.610" is fulfilled, no in-range fault is present; if, however, the inequality "2.000≦Vdet<3.590" or "3.610<Vdet≦4.000" holds, an in-range fault is present (all these inequalities are in the unit of volts).

FIG. 3 shows, in the form of a table, examples of fault locations and fault factors that are involved in in-range faults. In FIG. 3 are shown, as fault locations and fault factors, a first to a fifth fault location along with their respective fault factors. It should be noted that FIG. 3 enumerates fault locations and fault factors in not only this embodiment but also the other, later-described embodiments, and that the fourth and fifth fault locations and fault factors do not apply in this embodiment The first fault location is the AD converter 12, and the corresponding fault factors include, for example, abnormal accuracy of the integral non-linear error (INL) and the differential non-linear error (DNL) in AD conversion. The second fault location is the reference voltage generation portion 15, that is, where the reference voltage $Vref_{AD}$ for AD conversion is generated, and the corresponding fault factors include, for example, abnormal accuracy of the reference voltage $Vref_{AD}$. The third fault location is the AD front stage portion 11, and the corresponding fault factors include, for example, an abnormal offset voltage or an abnormal leakage current in the differential amplifier as the AD front stage portion 11 (an abnormal current value of the input current to the AD front stage portion 11). With respect to a fault factor, calling something "abnormal" means that the corresponding physical value (such as the value of an offset voltage) as actually observed deviates from that as designed by more than a predetermined permissible quantity.

For example, in a case where the AD converter 12 is a 10-bit AD converter, the designed voltage value of $Vref_{AD}$ is 5 V, and the output voltage Vo of the voltage source 2 is 4V, if due to the second fault factor the voltage value of $Vref_{AD}$ is actually 5.5 V, then because 4 V/(5.5 V/1024)×(1024/5 V)=3.64 V, the output voltage Vo of the voltage source 2 is erroneously detected to be 3.64 V.

For another example, when the true output voltage Vo of the voltage source 2 is 4.5 V, if due to a fault factor the detected voltage value Vdet is 4.0 V, then despite the voltage source 2 (battery) actually being in the overcharged state, the charge/discharge control portion 5 judges the voltage source 2 (battery) to be in the normal use state and permits its charging, posing danger. For yet another example, when the true output voltage Vo of the voltage source 2 is 2.5 V, if due to a fault factor the detected voltage value Vdet is 1.9 V, then despite the voltage source 2 (battery) is in the normal use state and can output electric power, the charge/discharge control portion 5 judges the voltage source 2 to be in the overdischarged state and needlessly inhibits the discharging of the voltage source 2 (thus diminishing the usable voltage range of the battery). In this way, presence of an in-range fault causes inconveniences such as increased danger and a diminished usable voltage range of the voltage source 2.

Figure 4:
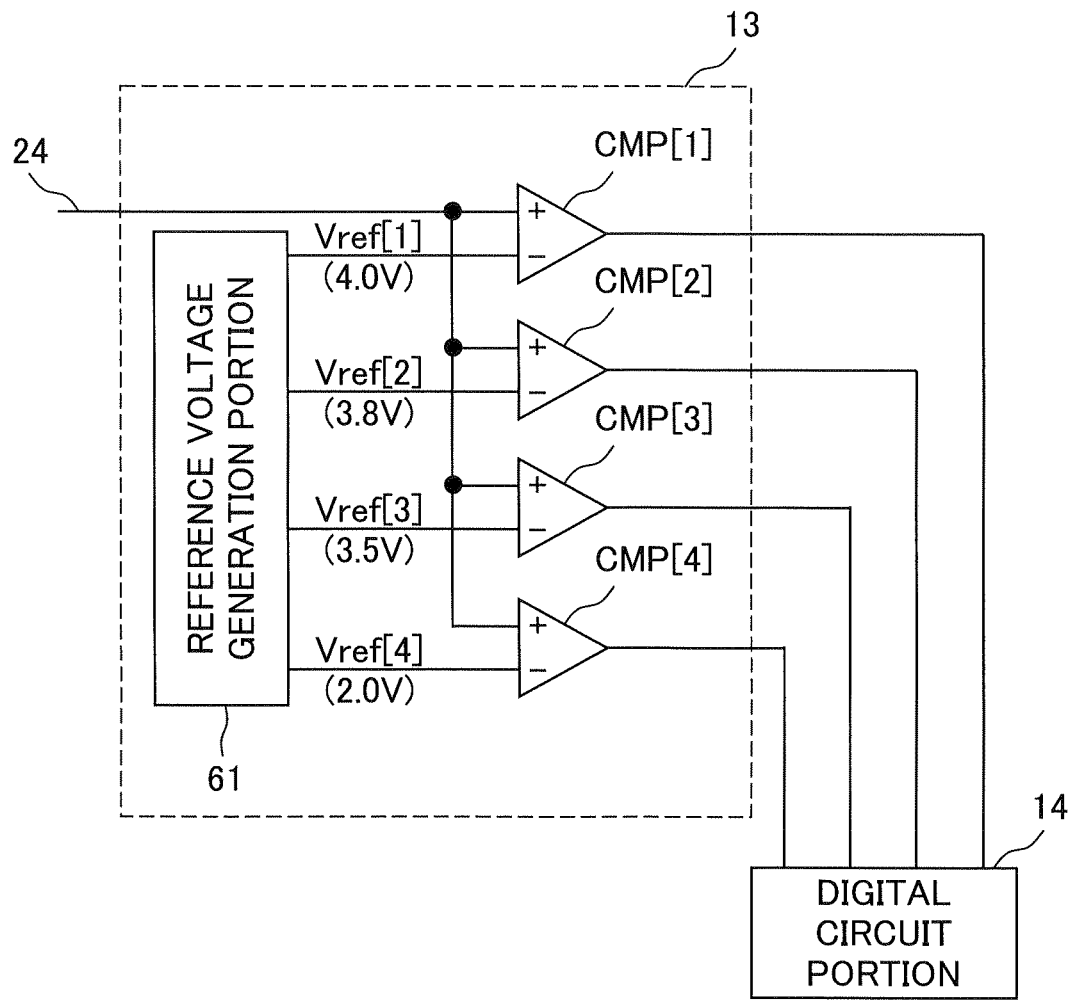
FIG. 4 is a diagram showing the internal circuit of the voltage level discrimination portion in FIG. 1.

FIG. 4 is an internal circuit diagram of the voltage level discrimination portion 13. The voltage level discrimination portion 13 is provided with a reference voltage generation portion 61 that generates four reference voltages Vref[1] to Vref[4], and comparators CMP[1] to CMP[4] that are connected to the voltage detection line 24 and to the reference voltage generation portion 61 and that compare the output voltage of the voltage source 2 with the reference voltages Vref[1] to Vref[4] respectively. Suppose here that the reference voltages Vref[1], Vref[2], Vref[3], and Vref[4] are set at 4.0 V, 3.8 V, 3.5 V, and 2.0 V respectively. In the reference voltage generation portion 61, the reference voltages Vref[1] to Vref[4] may be generated individually by separate circuits; alternatively, it is possible to generate the reference voltage Vref[1] first, for example, by use of the band gap voltage of a semiconductor and then divide the reference voltage Vref[1] with a plurality of voltage division resistors (unillustrated) to generate the reference voltages Vref[2] to Vref[4]. Incidentally, an overcharging/overdischarging detection circuit (unillustrated) may be diverted to formation of the voltage level discrimination portion 13 (FIG. 4). The overcharging/overdischarging detection circuit detects overcharging and overdischarging of the voltage source 2 by comparing the output voltage of the voltage source 2 with a reference voltage for overcharging detection and a reference voltage for overdischarging detection respectively. The overcharging/overdischarging detection circuit uses the overcharging detection reference voltage and the overdischarging detection reference voltage as Vref[1] and Vref[4] respectively, and in addition to the functions of this overcharging/overdischarging detection circuit, the voltage level discrimination portion 13 is further provided with the functions of comparing the output voltage of the voltage source 2 with another two reference voltages Vref[2] and Vref[3]. Needless to say, the number of reference voltages used in the voltage level discrimination portion 13 may be other than four.

The comparator CMP[i] compares the voltage on the voltage detection line 24 with the reference voltage Vref[i], outputting a digital signal "1" if the former is higher than the latter (Vref[i]), and outputting a digital signal "0" if the former is lower than the latter (Vref[i]). The output signal of the comparator CMP[i] is fed to the digital circuit portion 14. Here, i is 1, 2, 3, or 4.

Every moment that the digital signals outputted from the comparators CMP[1] to CMP[4] change, the digital circuit portion 14 compares the discriminated voltage value indicated by the output signals from the comparators CMP[1] to CMP[4] with the detected voltage value Vdet based on the output signal of the AD converter 12, thereby to detect whether or not an in-range fault is present. It is also possible, based on at least one of the discriminated voltage value and the detected voltage value Vdet, to detect whether or not the voltage source 2 is in the overcharged or overdischarged state.

For example, in the course of discharging of the LIB as the voltage source 2, when the output voltage Vo of the voltage source 2 shifts from a state lower than 4.0V but higher than 3.8 V to a state lower than 3.8 V but higher than 3.5 V, whereas the output digital signals of the comparators CMP[1], CMP[3], and CMP[4] remain "0," "1," and "1," the output digital signal of the comparator CMP[2] changes from "1" to "0." At the moment that this change occurs, the discriminated voltage value indicated by the output signals of the comparators CMP[1] to CMP[4] is the reference voltage value Vref[2] corresponding to the comparator CMP[2]. The digital circuit portion 14 compares the detected voltage value Vdet based on the output signal of the AD converter 12 as obtained immediately before or after that change with the reference voltage value Vref[2] corresponding to the comparator CMP[2]; if the absolute value of their difference |Vdet−Vref[2]| is greater than a predetermined fault discrimination threshold value $V_{TH}$ (for example, 10 mV), the digital circuit portion 14 judges that an in-range fault is present, and otherwise it judges that no in-range fault is present.

While the foregoing discusses an example of operation when the output voltage Vo of the voltage source 2 crosses Vref[2] from above to below, operation when the output voltage Vo of the voltage source 2 crosses Vref[2] from below to above is similar; also similar is operation when the output voltage Vo of the voltage source 2 crosses Vref[1], Vref[3], or Vref[4] from above to below or from below to above. When the output signals of the comparators CMP[1] to CMP[4] are all "1," the voltage source 2 is detected to be in the overcharged state; when the output signals of the comparators CMP[1] to CMP[4] are all "0," the voltage source 2 is detected to be in the overdischarged state.

Based on the results of the detection by the digital circuit portion 14, namely detection of the overcharged or overdischarged state and detection of whether or not an in-range fault is present, the charge/discharge control portion 5 controls the charging and discharging of the voltage source 2. Specifically, the charge/discharge control portion 5 controls the charge/discharge portion including the load 3 and the charge circuit 4 in such a way that, if during the charging of the voltage source 2 the overcharged state, or occurrence of an in-range fault, is detected, the charging of the voltage source 2 by the charge circuit 4 is stopped, and that if during the discharging of the voltage source 2 the overdischarged state, or occurrence of an in-range fault, is detected, the discharging of the voltage source 2 for the load 3 is stopped. The discharging of the voltage source 2 can be stopped by cutting off an unillustrated switch provided between the voltage source 2 and the load 3. If the voltage source 2 is judged to be in the overcharged or overdischarged state, or an in-range fault is judged to be present, the user may be warned of it by use of a display portion (unillustrated), a speaker (unillustrated), or the like connected to the voltage detection apparatus 1 or the charge/discharge control portion 5.

According to this embodiment, whether or not an in-range fault is present in the voltage detection circuit part (voltage detection portion), that is, the part downstream of the branch point 22, for making the AD converter 12 output the detected value of the output voltage Vo of the voltage source 2 can be detected with high accuracy, irrespective of the severity or cause (factor) of the fault. This voltage detection circuit part includes the AD front stage portion 11, the AD converter 12, the reference voltage generation portion 15, and the wiring connecting them together.

Figure 13:
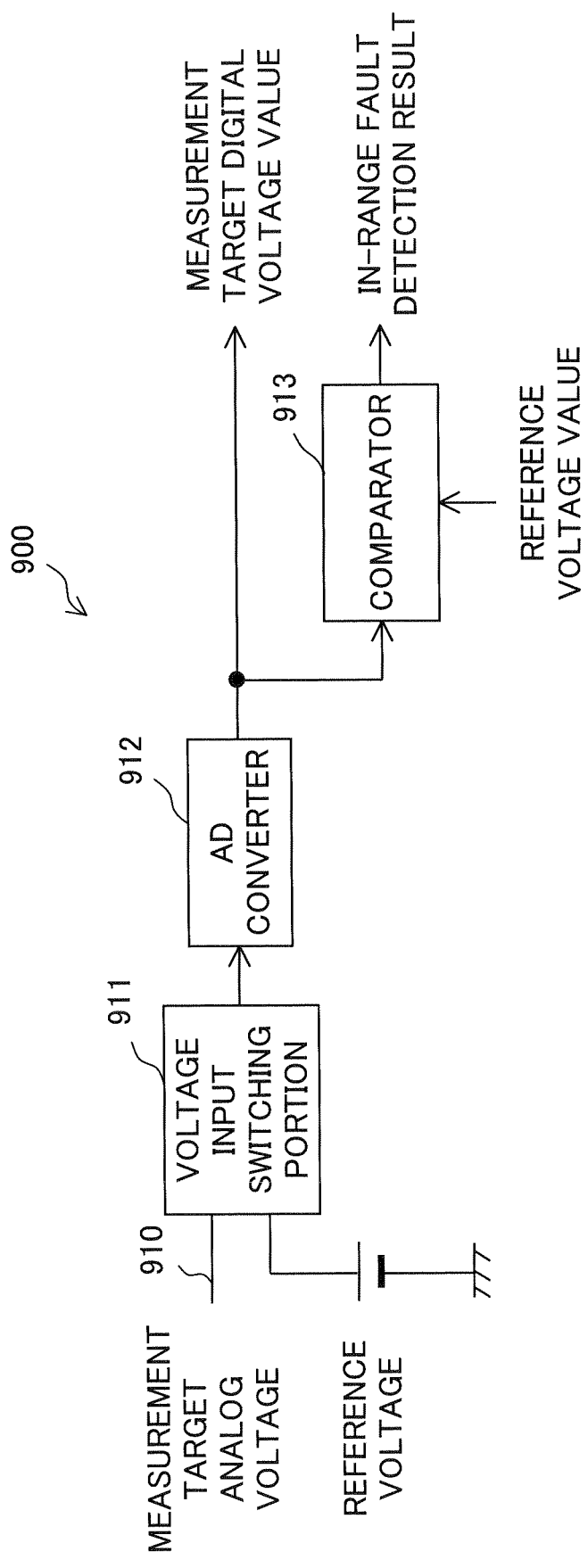
FIG. 13 is an overall block diagram of a conventional voltage detection apparatus.
Figure 14:
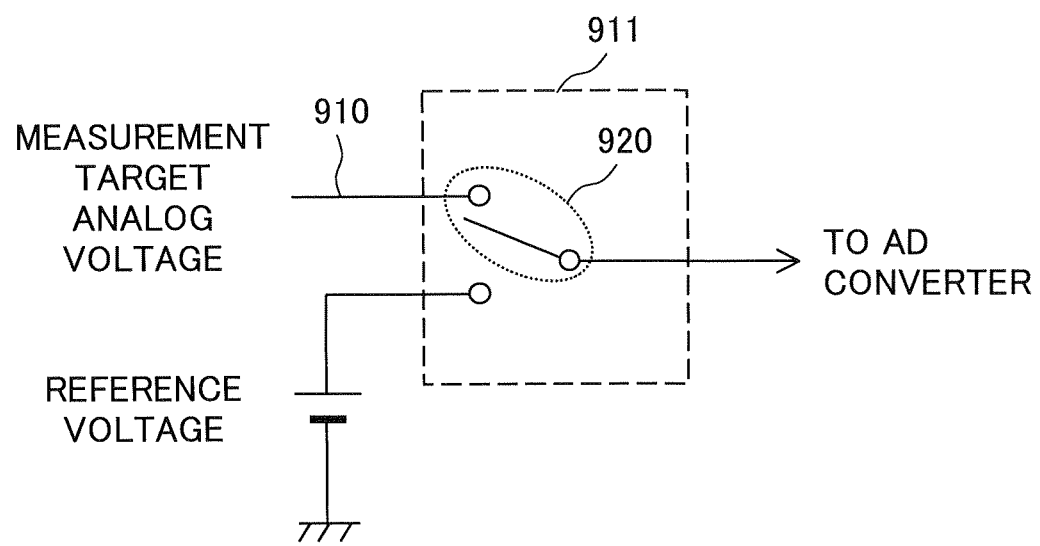
FIG. 14 is a block diagram of part of a voltage detection apparatus, including an equivalent circuit diagram of the voltage input switching portion in FIG. 13.

As described earlier, with the voltage detection apparatus 900 shown in FIG. 13 (see also FIG. 14), since an in-range fault resulting from an abnormality in the switch portion 920 within the voltage input switching portion 911 cannot be detected, if an abnormality is present in the switch portion 920, the voltage value of the measurement target will continue to be erroneously detected. By contrast, with the configuration of this embodiment, there is no need for a voltage input switching portion in the first place, and therefore an in-range fault never fails to be detected. Even in a case where, for discussion's sake, a voltage input switching portion is provided between the branch point 22 and the AD front stage portion 11, it is possible, with the voltage level discrimination portion 13 provided in a path different from that passing through the voltage input switching portion, to detect an in-range fault resulting from an abnormality in the voltage input switching portion.

Even when no in-range fault is present in the above-mentioned voltage detection circuit part, if, for discussion's sake, an abnormality is present in the reference voltage Vref[i] generated by the reference voltage generation portion 61, the absolute value of the above-mentioned difference |Vdet−Vref[i]| is abnormally great, and therefore an in-range fault is judged to be present. Thus, it can also be said that the voltage detection apparatus 1 is capable of detecting an in-range fault resulting from an abnormality in the voltage level discrimination portion as well. This applies also to the later-described voltage detection apparatuses 1$a$ and 101 (see FIGS. 5 and 7).

Incidentally, in a case where the potentials at the reference potential points 6 and 7 are equal, the AD front stage portion 11 may be omitted from the voltage detection apparatus 1 (the same applies also to the other, later-described embodiments). In that case, the wiring that would otherwise be connected to the input terminal $11_{IN}$ is directly connected to the input terminal $12_{IN}$.

Although it is here assumed that the voltage source 2 is a LIB, the voltage source 2 (and the voltage sources 2[1] to 2[8] described later) may be any secondary battery other than a LIB, or a battery that cannot be recharged or is unsuitable for recharging, or a voltage source other than a battery. Batteries that are not rechargeable and batteries that are unsuitable for recharging include primary batteries such as alkaline batteries, and fuel cells.

Although the above description deals with a configuration in which the voltage level of the output voltage of the voltage source 2 is discriminated by use of four comparators, the number of comparators for discriminating the voltage level may be other than four (the same applies also to the other, later-described embodiments). Preferably, the one or more reference voltages with which the output voltage of the voltage source 2 is compared by the comparators include a voltage within the normal voltage range (in the example above, for example, 3.8 V).

Embodiment 2

A voltage detection apparatus according to a second embodiment (Embodiment 2) of the invention will now be described. In Embodiment 2, it is assumed that there is one target of voltage measurement, and that the voltage detection apparatus is provided with a protection circuit for protecting the measurement target from short-circuiting and the like.

Figure 5:
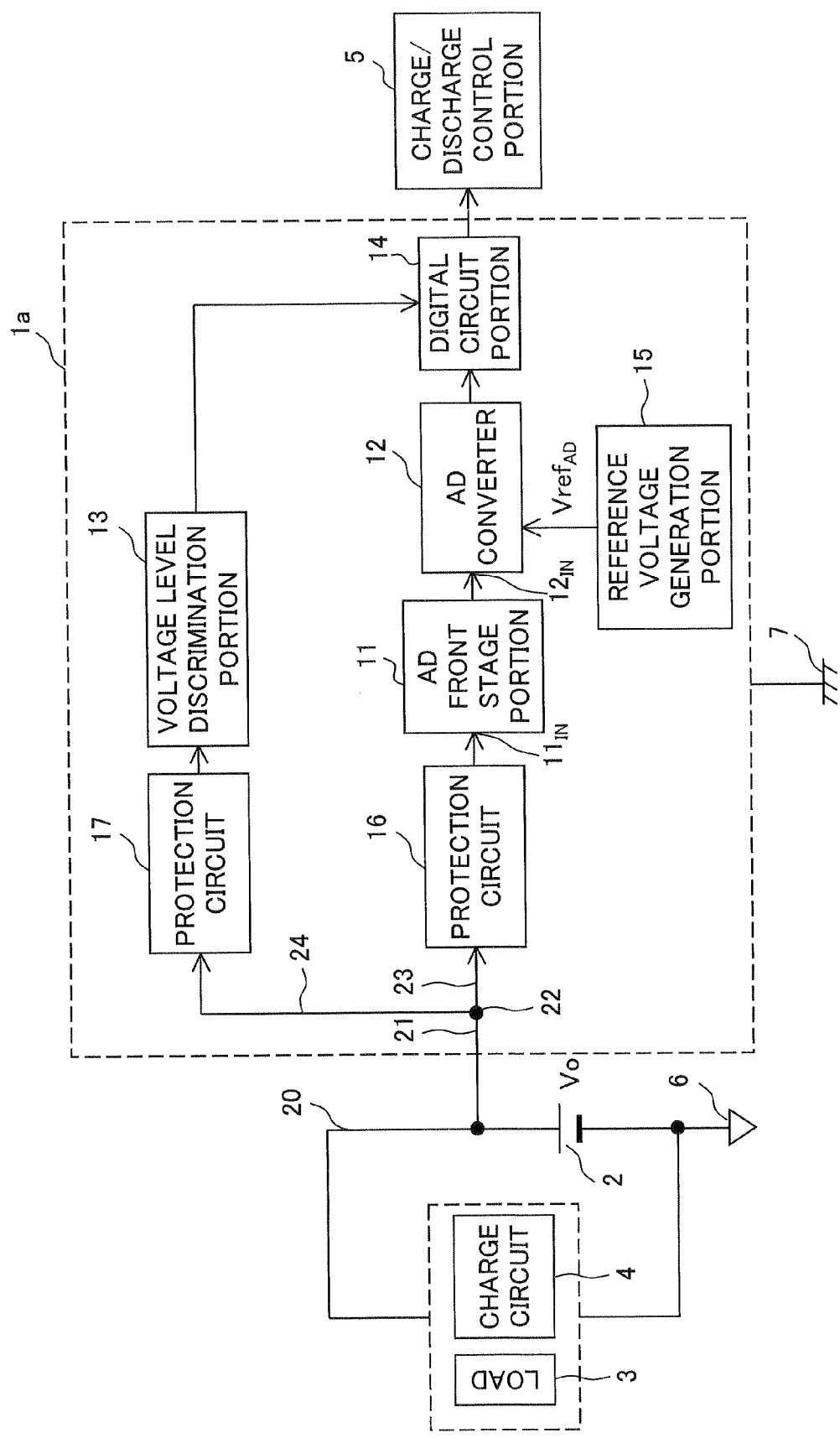
FIG. 5 is a block diagram of a voltage detection apparatus and blocks accompanying it according to Embodiment 2 of the invention.

FIG. 5 is an internal block diagram of the voltage detection apparatus 1$a$ according to Embodiment 2. In FIG. 5 are also shown elements that are external to, and are connected to, the voltage detection apparatus 1$a$. Compared with the voltage detection apparatus 1 in FIG. 1, the voltage detection apparatus 1$a$ is additionally provided with protection circuits 16 and 17. Except for this addition, the voltage detection apparatus 1$a$ is similar to the voltage detection apparatus 1. Accordingly, the following description discusses the protection circuits 16 and 17.

The protection circuit 16 is provided serially in the voltage detection line 23 between the branch point 22 and the AD front stage portion 11; the protection circuit 17 is provided serially in the voltage detection line 24 between the branch point 22 and the voltage level discrimination portion 13.

Figure 6:
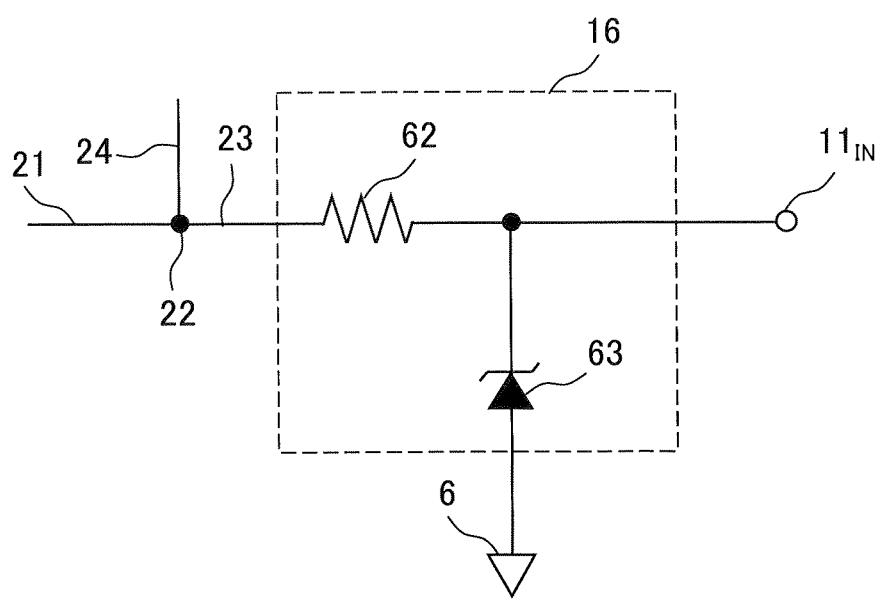
FIG. 6 is a diagram showing the internal circuit of a protection circuit in FIG. 5.

FIG. 6 is an internal circuit diagram of the protection circuit 16. The protection circuit 16 is provided with a protective resistor 62 interposed serially between the branch point 22 and the input terminal $11_{IN}$ of the AD front stage portion 11, and an anti-surge device 63 interposed serially between, at one end, the node between the protective resistor 62 and the input terminal $11_{IN}$ and, at the other end, the reference potential point 6. The protective resistor 62 limits the current that passes from the voltage source 2 through the protective resistor 62 when a circuit part (including wiring) on the AD front stage portion 11 side of the protective resistor 62 is short-circuited to the reference potential point 6 or the like. The anti-surge device 63 comprises a Zener diode or the like, and diverts a surge current that occurs in a circuit part (including wiring) on the AD front stage portion 11 side of the protective resistor 62 to the reference potential point 6.

The internal circuit of the protection circuit 17 is similar to that of the protection circuit 16. The differences are that, in the protection circuit 17, the protective resistor 62 is interposed serially between the branch point 22 and the voltage level discrimination portion 13, and that, in the protection circuit 17, the anti-surge device 63 is interposed serially between, at one end, the node between the protective resistor 62 within the protection circuit 17 and the voltage level discrimination portion 13 and, at the other end, the reference potential point 6.

The above-described circuit configuration of the protection circuits 16 and 17 is merely an example, and their circuit configuration may be modified in many ways. The protection circuits 16 and 17 may be given different circuit configurations. The protection circuit 17 may be omitted from the voltage detection apparatus 1$a$.

In a case where the protection circuit 16 is provided, the protection circuit 16 can be a fourth fault location (see FIG. 3) of an in-range fault. The corresponding fault factors include, for example, an abnormal resistance in the protective resistor 62, and an abnormal leakage current in the anti-surge device 63.

In a case where, for discussion's sake, the AD front stage portion 11 draws a current of 10 μA is from the voltage source 2, if the actual resistance of the protective resistor 62 in the protection circuit 16 is 100 times its designed value of 1 kΩ, that is, 100 kΩ, the detected voltage value Vdet based on the output signal of the AD converter 12 will then be about 1 V lower than the actual value of the output voltage Vo. Even then, however, with the voltage detection apparatus 1a, such an in-range fault can be detected with high accuracy by use of the output of the voltage level discrimination portion 13.

That is, according to this embodiment, whether or not an in-range fault is present in the voltage detection circuit part (voltage detection portion), that is, the part downstream of the branch point 22, for making the AD converter 12 output the detected value of the output voltage Vo of the voltage source 2 can be detected with high accuracy, irrespective of the severity or cause (factor) of the fault. This voltage detection circuit part includes the protection circuit 16, the AD front stage portion 11, the AD converter 12, the reference voltage generation portion 15, and the wiring connecting them together.

Embodiment 3

A third embodiment (Embodiment 3) of the invention will now be described. In Embodiment 3, it is assumed that there are a plurality of targets of voltage measurement.

Figure 7:
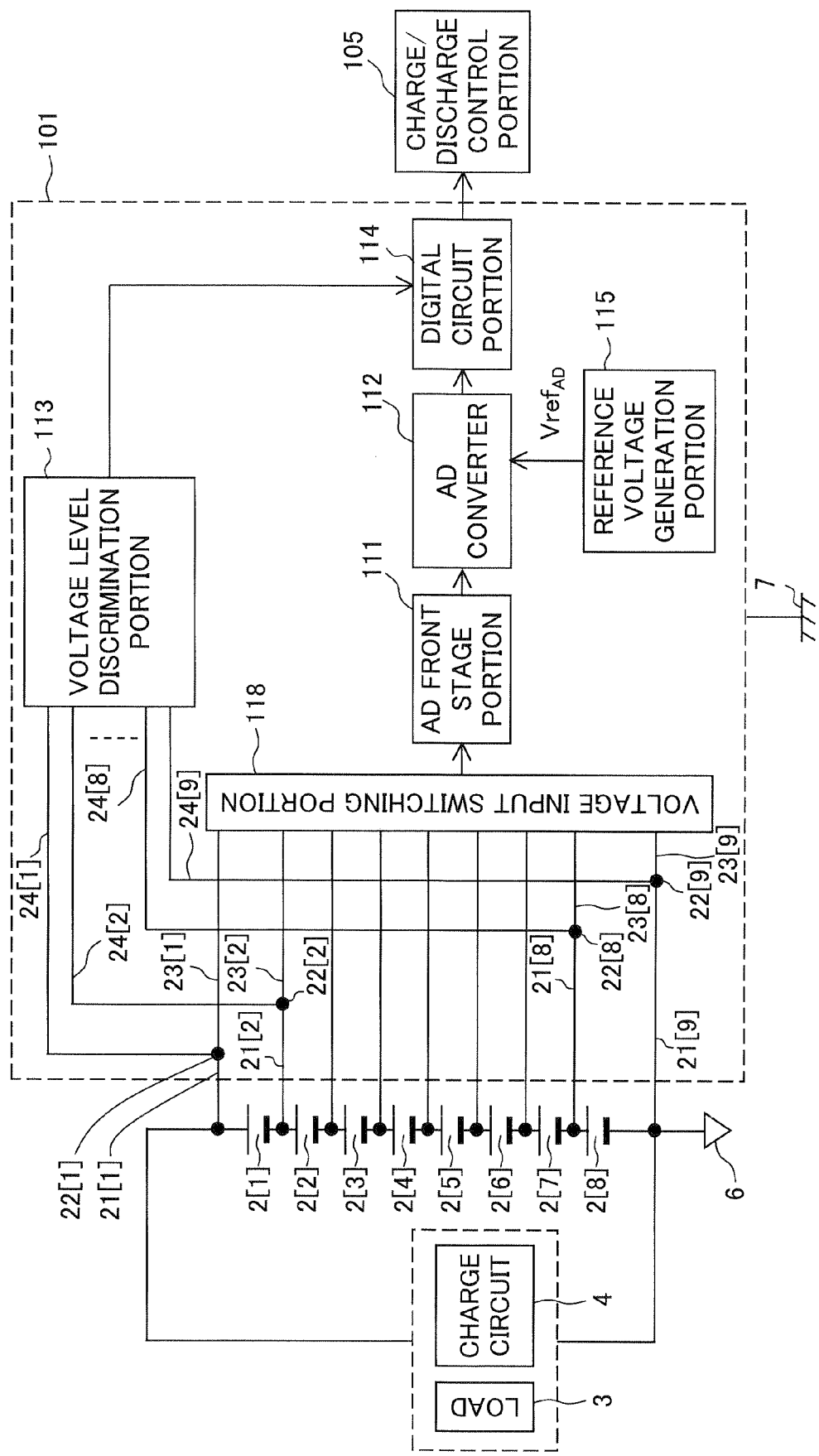
FIG. 7 is a block diagram of a voltage detection apparatus and blocks accompanying it according to Embodiment 3 of the invention.

FIG. 7 is an internal block diagram of a voltage detection apparatus 101 according to Embodiment 3. In FIG. 7 are also shown elements that are external to, and are connected to, the voltage detection apparatus 101. The voltage detection apparatus 101 is provided with blocks identified by the reference signs 111 to 115 and 118. Unless inconsistent, any feature mentioned with regard to Embodiment 1 or 2 applies to Embodiment 3 as well. For such application, differences in the reference signs identifying blocks of the same names (for example, the difference between the reference signs 11 and 111 which both identify the AD front stage portion) are to be ignored wherever appropriate.

The blocks provided within the voltage detection apparatus 101 all operate relative to the potential at the reference potential point 7. The reference signs 2[1] to 2[8] each identify a voltage source as a target of voltage measurement. Suppose here that the voltage sources 2[1] to 2[8] are each a LIB having characteristics similar to those of the voltage source 2. The voltage sources 2[1] to 2[8] have voltage sources 2[1], 2[2], 2[3], 2[4], 2[5], 2[6], 2[7], and 2[8] connected serially in this order from the high-voltage side, with the negative output terminal of the voltage source 2[8] connected to the reference potential point 6.

Between the positive output terminal of the voltage source 2[1] and the negative output terminal of the voltage source 2[8], a charge/discharge portion composed of a load 3 and a charge circuit 4 is connected. During the discharging of the LIBs as the voltage sources 2[1] to 2[8], the load 3 is driven by the voltage between the positive output terminal of the voltage source 2[1] and the negative output terminal of the voltage source 2[8]. During the charging of the LIBs as the voltage sources 2[1] to 2[8], the charging of the voltage sources 2[1] to 2[8] is achieved by the operation of the charge circuit 4. A charge/discharge control portion 105 has functions similar to those of the charge/discharge control portion 5 described previously; specifically, it controls the charging of the voltage sources 2[1] to 2[8] by use of the charge circuit 4, and controls the discharging of the voltage sources 2[1] to 2[8] for the load 3.

For individual detection of each of the output voltages of the voltage sources 2[1] to 2[8], voltage detection lines are drawn from the positive output terminal of each of the voltage sources 2[1] to 2[8] and from the negative output terminal of the voltage source 2[8]. The voltage detection line drawn from the positive output terminal of the voltage source 2[j] will be identified by 21[j], and the voltage detection line drawn from the negative output terminal of the voltage source 2[8] will be identified by 21[9]. Here, j is an integer of 9 or less. Neither the discharge current from the voltage sources 2[1] to 2[8] to the load 3 nor the charge current from the charge circuit 4 to the voltage sources 2[1] to 2[8] passes across any voltage detection line 21[j].

The voltage detection apparatus 101 feeds, as a target voltage of AD conversion, the voltage between the voltage detection lines 21[j] and 21[j+1] to an AD converter 112 via a voltage input switching portion 118 and an AD front stage portion 111, so as thereby to detect, as a digital voltage signal, the voltage between the voltage detection lines 21[j] and 21[j+1], that is, the output voltage of the voltage source 2[j].

The voltage detection line 21[j] branches into two of them at a branch point 22[j], one being connected to the voltage input switching portion 118 and the other being connected to a voltage level discrimination portion 113. The voltage detection line leading from the branch point 22[j] to the voltage input switching portion 118 will be identified by the reference sign 23[j], and the voltage detection line leading from the branch point 22[j] to the voltage level discrimination portion 113 will be identified by the reference sign 24[j]. The analog voltage signal representing the output voltage of the voltage source 2[j], which is relative to the potential on the voltage detection line 21[j+1], first passes across the voltage detection line 21[j], then branches off the voltage detection line 21[j] at the branch point 22[j], and then continues to pass across the voltage detection lines 23[j] and 24[j].

The voltage input switching portion 118 comprises a multiplexer or the like; it selects two of the voltage detection lines 23[1] to 23[9] and connects them to the AD front stage portion 111 in such a way that one at a time of the following analog voltage signals is selected sequentially and periodically and is converted into a digital voltage signal by the AD converter 112: the analog voltage signals between the voltage detection lines 23[1] and 23[2], between the voltage detection lines 23[2] and 23[3], between the voltage detection lines 23[3] and 23[4], between the voltage detection lines 23[4] and 23[5], between the voltage detection lines 23[5] and 23[6], between the voltage detection lines 23[6] and 23[7], between the voltage detection lines 23[7] and 23[8], and between the voltage detection lines 23[8] and 23[9]. Specifically, the voltage input switching portion 118 selects one at a time of the following pairs of voltage detection lines sequentially and periodically and connects them to the AD front stage portion 111: the voltage detection lines 23[1] and 23[2], the voltage detection lines 23[2] and 23[3], the voltage detection lines 23[3] and 23[4], the voltage detection lines 23[4] and 23[5], the voltage detection lines 23[5] and 23[6], the voltage detection lines 23[6] and 23[7], the voltage detection lines 23[7] and 23[8], and the voltage detection lines 23[8] and 23[9].

The AD front stage portion 111 is a buffer circuit that feeds, as a target voltage of AD conversion, the voltage between the two voltage detection lines [j] and [j+1] selected by the voltage input switching portion 118 to the AD converter 112. The AD front stage portion 111 comprises, for example, a differential amplifier or a flying capacitor.

Relative to a reference voltage $Vref_{AD}$ generated by a reference voltage generation portion 115, the AD converter 112 periodically converts the AD conversion target voltage delivered from the AD front stage portion 111 into a digital voltage. In other words, it converts the analog voltage signal representing the AD conversion target voltage into a digital voltage signal. The obtained digital voltage signal is outputted to a digital circuit portion 114. The voltage detection apparatus 101 previously knows the voltage value of the reference voltage $Vref_{AD}$.

The voltage level discrimination portion 113 discriminates the voltage levels of the output voltages of the voltage sources 2[1] to 2[8] individually based on the analog voltage signals on the voltage detection lines 24[1] to 24[9]. Specifically, for each of the voltage sources 2[1] to 2[8], the voltage level discrimination portion 113 discriminates which of a plurality of different voltage ranges the voltage value of the output voltage of that voltage source is in. Put in yet another way, for each of the voltage sources 2[1] to 2[8], the voltage level discrimination portion 113 detects the output voltage of that voltage source at a resolution coarser than the voltage detection resolution of the AD converter 112. A digital signal representing the results of the discrimination by the voltage level discrimination portion 113 is outputted to the digital circuit portion 114. The output voltage values of the voltage sources as discriminated by the voltage level discrimination portion 113 will be referred to also as the discriminated voltage values.

The digital circuit portion 114 has a function as a fault detection portion; based on the output signals of the AD converter 112 and the voltage level discrimination portion 113, the digital circuit portion 114 detects whether or not the LIBs as the voltage sources 2[1] to 2[8] are in an overcharged or overdischarged state, and also detects whether or not an in-range fault is present.

In the voltage detection apparatus 101, possible fault locations of in-range faults include, in addition to the first to third fault locations mentioned previously, a fifth fault location (see FIG. 3). The fifth fault location is the voltage input switching portion 118, and the corresponding fault factors include, for example, an abnormal resistance value in the on-state resistance in a switch portion within the multiplexer and an abnormal leakage current in that switch portion. For example, while the on-state resistance of the switch portion within the multiplexer as the voltage input switching portion 118 is normally supposed to be about several Ω, if the on-state resistance is 10 kΩ, the detected voltage value Vdet based on the output voltage of the AD converter 112 deviates from the true value by the amount equal to the product of the current passing through the switch portion multiplied by the on-state resistance (10 kΩ).

Figure 8:
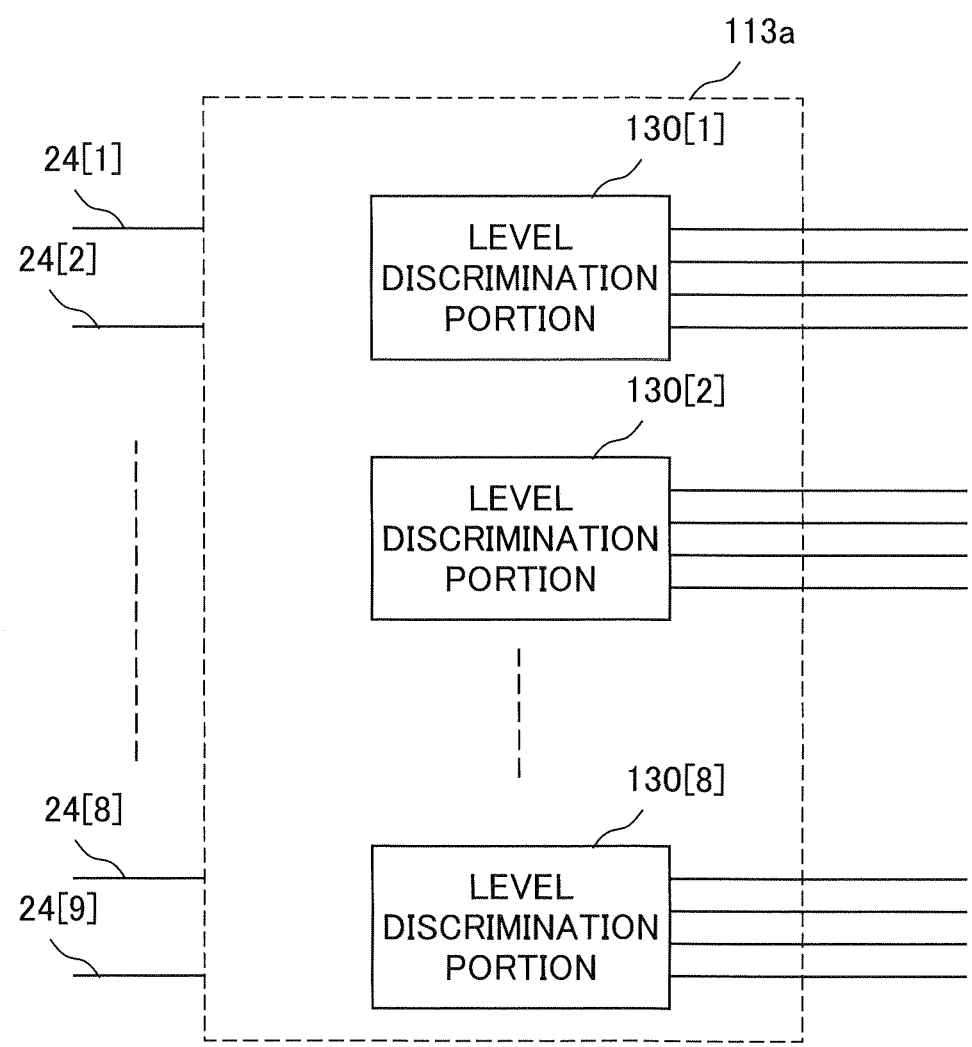
FIG. 8 is a diagram showing a first example of the internal configuration of the voltage level discrimination portion in FIG. 7.

The voltage level discrimination portion 113 can be built by providing eight circuits each similar to the voltage level discrimination portion 13 described with regard to Embodiment 1. In that case, as shown in FIG. 8, within a voltage level discrimination portion 113a adoptable as the voltage level discrimination portion 113, eight level discrimination portions 130[1] to 130[8] are provided, and each level discrimination portion is provided with four comparators. Specifically, each level discrimination portion 130[j] is provided with four comparators that compare the analog voltage between the voltage detection lines 24[j] and 24[j+1] with reference voltages Vref[1] to Vref[4] respectively and output comparison results.

Then, for example, at the moment that the output signals of the four comparators included in the level discrimination portion 130[1] change, the digital circuit portion 114 can accurately detect the output voltage of the voltage source 2[1] based on the output signals of the four comparators. In addition, at that same moment, by comparing the discriminated voltage value VL[1] indicated by the output signals of the four comparators within the level discrimination portion 130[1] with the corresponding detected voltage value Vdet[1], the digital circuit portion 114 can detect whether or not an in-range fault is present. Here, the detected voltage value Vdet[j] is the detected voltage value based on the output signal of the AD converter 112 as observed when, as the target voltage of AD conversion, the analog voltage between the voltage detection lines 23[j] and 23[j+1] is being fed to the AD converter 112.

The method here for detecting whether or not an in-range fault is present based on the result of comparison between the discriminated voltage value VL[1] and the detected voltage value Vdet[1] is similar to that described with regard to Embodiment 1. Specifically, for example, if |Vdet[1]−VL[1]| is greater than a predetermined fault discrimination threshold value $V_{TH}$ (for example, 10 mV), an in-range fault is judged to be present; otherwise, no in-range fault is judged to be present. Although the foregoing discusses, as an example, the level discrimination portion 130[1] corresponding to the voltage source 2[1], a similar description applies to the level discrimination portions 130[2] to 130[8] corresponding to the voltage sources 2[2] to 2[8].

It is also possible, based on at least one of the discriminated voltage value according to the level discrimination portion 130[j] and the detected voltage value Vdet[j] based on the output signal of the AD converter 112, to detect whether or not the voltage source 2[j] is in the overcharged or overdischarged state.

Figure 9:
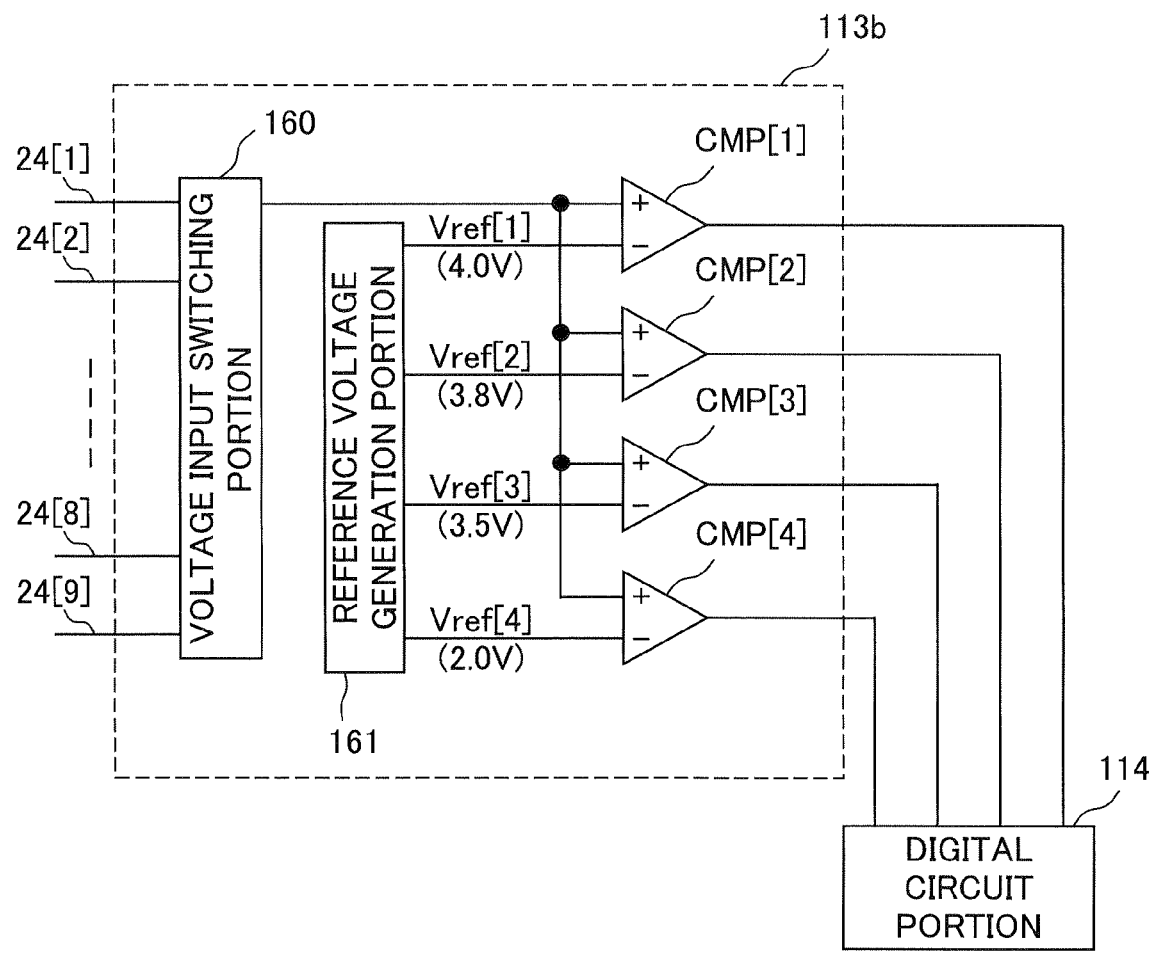
FIG. 9 is a diagram showing a second example of the internal configuration of the voltage level discrimination portion in FIG. 7.

As the voltage level discrimination portion 113, a voltage level discrimination portion 113b as shown in FIG. 9 may be used. FIG. 9 shows the internal circuit of the voltage level discrimination portion 113b. The voltage level discrimination portion 113b is provided with a voltage input switching portion 160, a reference voltage generation portion 161, and comparators CMP[1] to CMP[4].

The voltage input switching portion 160 is connected to the voltage detection lines 24[1] to 24[9]; it selects one at a time of the following analog voltage signals sequentially and periodically and feeds the selected analog voltage signal to the non-inverting input terminal (+input terminal) of each of the comparators CMP[1] to CMP[4]: the analog voltage signals between the voltage detection lines 24[1] and 24[2], between the voltage detection lines 24[2] and 24[3], between the voltage detection lines 24[3] and 24[4], between the voltage detection lines 24[4] and 24[5], between the voltage detection lines 24[5] and 24[6], between the voltage detection lines 24[6] and 24[7], between the voltage detection lines 24[7] and 24[8], and between the voltage detection lines 24[8] and 24[9]. In other words, the voltage input switching portion 160 feeds the analog voltage represented by the selected analog voltage signal to the non-inverting input terminals of the comparators CMP[1] to CMP[4].

The reference voltage generation portion 161 is a block similar to the reference voltage generation portion 61 in FIG. 4; it generates four reference voltages Vref[1] to Vref[4] and feeds them to the inverting input terminals (−input terminal) of the comparators CMP[1] to CMP[4] respectively. In each of the comparators CMP[1] to CMP[4], the analog voltage and the reference voltage fed to its non-inverting and inverting input terminals respectively are both voltages relative to the potential at the reference potential point 7.

Between the voltage input switching portion 160 and the AD-converter-side voltage input switching portion 118, synchronism is maintained such that, when the analog voltage between the voltage detection lines 24[j] and 24[j+1] is fed to the non-inverting input terminals of the comparators CMP[1] to CMP[4], the analog voltage between the voltage detection lines 23[j] and 23[j+1] is fed, as the target voltage of AD conversion, to the AD converter 112. Like the voltage input switching portion 118, the voltage input switching portion 160 can be built with a multiplexer. So that the analog voltage between the voltage detection lines 24[j] and 24[j+1] may be fed, relative to the potential at the reference potential point 7, to the non-inverting input terminals of the comparators CMP [1] to CMP[4], a differential amplifier or a flying capacitor equivalent to the AD front stage portion 111 may be provided between the multiplexer within the voltage input switching portion 160 and the comparators CMP[1] to CMP[4].

The period in which the voltage input switching portion 118 selects the analog voltage signal between the voltage detection lines 23[j] and 23[j+1] and the voltage input switching portion 160 selects the analog voltage signal between the voltage detection lines 24[j] and 24[j+1] will be called the jth detection period. As will be clear from the above description, in the jth detection period, the output voltage of the voltage source 2[j] is the target voltage of AD conversion in the AD converter 112. When attention is paid to one detection period and the corresponding one voltage source, the method for detecting whether or not an in-range fault is present, and the method for detecting an overcharged or overdischarged state, based on the output signals of the comparators CMP[1] to CMP[4] within the voltage level discrimination portion 113b and the output signal of the AD converter 112, are similar to those in Embodiment 1.

For example, with attention paid only to the first detection period and the voltage source 2[1], when the output voltage of the voltage source 2[1] shifts from a state lower than 4.0V but higher than 3.8 V to a state lower than 3.8 V but higher than 3.5 V, the output digital signal of the comparator CMP[2] changes from "1" to "0." The digital circuit portion 114 compares the detected voltage value Vdet[1] based on the output signal of the AD converter 112 obtained immediately before or after that change with the reference voltage value Vref[2] corresponding to the comparator CMP[2]; if the absolute value of their difference |Vdet[1]−Vref[2]| is greater than a predetermined fault discrimination threshold value $V_{TH}$ (for example, 10 mV), the digital circuit portion 114 judges that an in-range fault is present, and otherwise it judges that no in-range fault is present. Moreover, in the first detection period, when the output signals of the comparators CMP[1] to CMP[4] are all "1," the voltage source 2[1] is detected to be in the overcharged state; when the output signals of the comparators CMP[1] to CMP[4] are all "0," the voltage source 2[1] is detected to be in the overdischarged state. The same applies also to the second to eighth detection periods and to the voltage sources 2[2] to 2[8].

Based on the results of the detection by the digital circuit portion 114, namely detection of the overcharged or overdischarged state and detection of whether or not an in-range fault is present, the charge/discharge control portion 105 controls the charging and discharging of the voltage sources 2[1] to 2[8]. Specifically, the charge/discharge control portion 105 controls the charge/discharge portion including the load 3 and the charge circuit 4 in such a way that, if during the charging of the voltage sources 2[1] to 2[8] the overcharged state, or occurrence of an in-range fault, is detected, the charging of the voltage sources 2[1] to 2[8] by the charge circuit 4 is stopped, and that if during the discharging of the voltage sources 2[1] to 2[8] the overdischarged state, or occurrence of an in-range fault, is detected, the discharging of the voltage sources 2[1] to 2[8] for the load 3 is stopped. The discharging of the voltage sources 2[1] to 2[8] can be stopped by cutting off an unillustrated switch provided between the voltage sources 2[1] to 2[8] and the load 3. If the voltage sources 2[1] to 2[8] is judged to be in the overcharged or overdischarged state, or an in-range fault is judged to be present, the user may be warned of it by use of a display portion (unillustrated), a speaker (unillustrated), or the like connected to the voltage detection apparatus 101 or the charge/discharge control portion 105.

As the voltage detection apparatus 1 in FIG. 1 can be modified to the voltage detection apparatus 1a in FIG. 5, so the voltage detection apparatus 101 in FIG. 7 may be additionally provided with a protection circuit. For example, protection circuits similar to the protection circuit 16 may be serially inserted one in each of the voltage detection lines 23[1] to 23[9] between the branch points 22[1] to 22[9] and the voltage input switching portion 118. Furthermore, for example, protection circuits similar to the protection circuit 17 may be serially inserted one in each of the voltage detection lines 24[1] to 24[9] between the branch points 22[1] to 22[9] and the voltage level discrimination portion 113.

Figure 10:
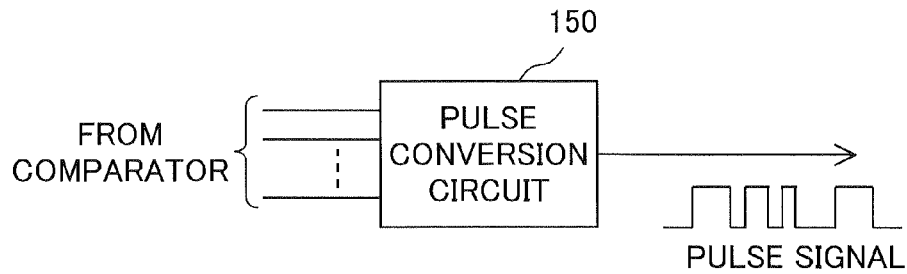
FIG. 10 is a diagram illustrating a pulse conversion circuit according to Embodiment 3 of the invention.

A pulse conversion circuit 150 as shown in FIG. 10 may be additionally provided within, or outside, the voltage detection apparatus 101. The pulse conversion circuit 150 converts the output signals of the comparators within the level discrimination portions 130[1] to 130[8] in FIG. 8, or the output signals of the comparators within the level discrimination portion 113b in FIG. 9, into a pulse signal. This pulse signal represents, in the form of the duty ratios of pulses, the discriminated voltage values of the voltage sources 2[1] to 2[8] as discriminated by the voltage level discrimination portion 113. For example, the reference voltages Vref[1] to Vref[4] are assigned duty ratios of 80%, 60%, 40%, and 20% respectively, and as the above-mentioned pulse signal, a train of pulses is outputted in which the following pulses are connected together along the time axis: a pulse with a duty ratio corresponding to the discriminated voltage value of the voltage source 2[1], a pulse with a duty ratio corresponding to the discriminated voltage value of the voltage source 2[2], . . . , and a pulse with a duty ratio corresponding to the discriminated voltage value of the voltage source 2[8]. Such a pulse signal can be used to convey whether or not each voltage source is in the overcharged or overdischarged state.

According to this embodiment, whether or not an in-range fault is present in the voltage detection circuit part (voltage detection portion), that is, the part downstream of the branch points 22[1] to 22[9], for making the AD converter 112 output the detected values of the output voltages of the voltage sources 2[1] to 2[8] can be detected with high accuracy, irrespective of the severity or cause (factor) of the fault. This voltage detection circuit part includes the voltage input switching portion 118, the AD front stage portion 111, the AD converter 112, the reference voltage generation portion 115, and the wiring connecting them together. In a case where protection circuits are provided in the voltage detection lines 23[1] to 23[9], those protection circuits also are included in the just-mentioned voltage detection circuit part. Adopting as the voltage level discrimination portion 113 the voltage level discrimination portion 113b in FIG. 9, as compared with the voltage level discrimination portion 113a in FIG. 8, helps reduce the number of reference voltages and the number of comparators.

Although this embodiment takes up, as an example of a voltage source portion composed of a plurality of voltage sources, a voltage source portion having eight voltage sources connected serially, the number of voltage sources included in the voltage source portion may be other than eight, and the plurality of voltage sources included in the voltage source portion may be connected parallel.

Although the operation of the voltage detection apparatuses (1, 1a, and 101) according to the first to third embodiments has been described with special attention paid to the method for detecting in-range faults, the configurations of the voltage detection apparatuses (1, 1a, and 101) according to the first to third embodiments also permit detection of out-of-range faults. An out-of-range fault denotes a major fault that is not classified into in-range faults. On occurrence of an out-of-range fault, the detected voltage value Vdet according to the AD converter (12 or 112) deviates from the true voltage value more than on occurrence of an in-range fault. For detection of an out-of-range fault, preferably, a fault discrimination threshold value $V_{TH}'$ for out-of-range fault detection is used instead of the above-mentioned fault discrimination threshold value $V_{TH}$ for in-range fault detection (where $V_{TH}'>V_{TH}$). Except using different fault discrimination threshold values, the method for detecting in-range faults and the method for detecting out-of-range faults are similar. By comparing the difference between the discriminated voltage value according to the voltage level discrimination portion (13 or 113) and the detected voltage value Vdet according to the AD converter (12 or 112) with each of the fault discrimination threshold values $V_{TH}$ and $V_{TH}'$, it is possible to detect in-range and out-of-range faults with distinction made between them.

Let the lower and upper limit values of the voltage range which the output voltage of a voltage source is supposed to be in be Va and Vb respectively (where 0<Va<Vb). It is then possible to judge that an out-of-range fault is present on detection of a voltage equal to or lower than Va or a voltage equal to or higher than Vb as the output voltage of the voltage source. Specifically, it is possible to judge that an out-of-range fault is present if the detected voltage value Vdet according to the AD converter (12 or 112) is equal to or lower than Va, or equal to higher than Vb. Also with this method, it is possible to detect in-range and out-of-range faults with distinction made between them. If no such distinction is needed, only the above-described detection of in-range faults may be executed. This is because, since the detected voltage value Vdet deviates from the true voltage value more on occurrence of an out-of-range fault than on occurrence of an in-range fault, detecting in-range faults alone permits fault detection also on occurrence of out-of-range faults.

Embodiment 4

Figure 11:
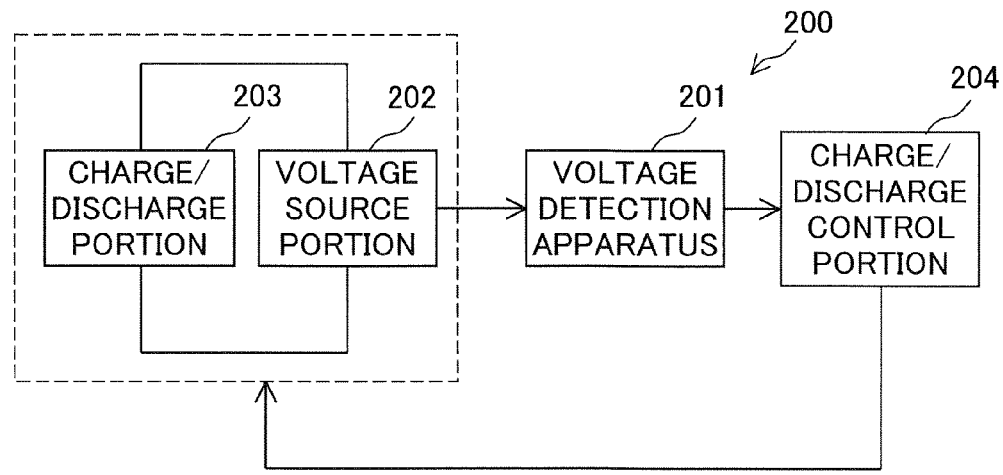
FIG. 11 is a block diagram of a battery system according to Embodiment 4 of the invention.

A battery system according to a fourth embodiment (Embodiment 4) of the invention will now be described. FIG. 11 is a block diagram of the battery system 200 according to Embodiment 4.

The battery system 200 at least includes a voltage detection apparatus 201 and a voltage source portion 202. The battery system 200 may further include a charge/discharge portion 203, or a charge/discharge control portion 204, or both. The battery system 200 may in addition include a pulse conversion circuit 150 as shown in FIG. 10.

The configuration described with regard to Embodiment 1 or 2 is applicable to the battery system 200. In that case, the voltage detection apparatus 201 is the voltage detection apparatus 1 or 1a, the voltage source portion 202 is the voltage source 2, the charge/discharge portion 203 is the charge/discharge portion including the load 3 and the charge circuit 4, and the charge/discharge control portion 204 is the charge/discharge control portion 5.

The configuration described with regard to Embodiment 3 also is applicable to the battery system 200. In that case, the voltage detection apparatus 201 is the voltage detection apparatus 101, the voltage source portion 202 is composed of the voltage sources 2[1] to 2[8], the charge/discharge portion 203 is the charge/discharge portion including the load 3 and the charge circuit 4, and the charge/discharge control portion 204 is the charge/discharge control portion 105.

Here, it is assumed that the voltage source portion 202 is composed of one or more batteries (for example, LIBs), and this is the reason that the system identified by the reference sign 200 is called a battery system. The voltage source portion 202, however, may be composed of one or more voltage sources other than batteries, in which case the term "battery system" is read as "voltage source system."

Embodiment 5

Figure 12:
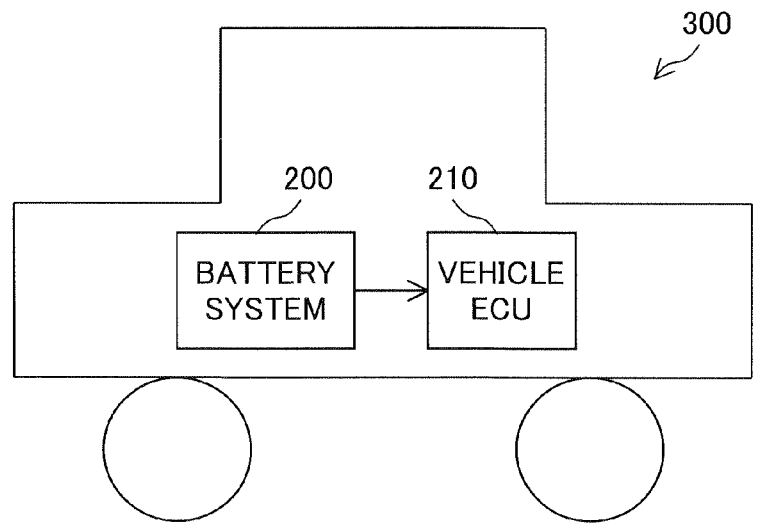
FIG. 12 is a configuration diagram of an electric vehicle according to Embodiment 5 of the invention.

An electric vehicle according to a fifth embodiment (Embodiment 5) of the invention will now be described. FIG. 12 is a configuration diagram of the electric vehicle 300 according to Embodiment 5. The electric vehicle 300 incorporates the battery system 200 according to Embodiment 4 and a vehicle ECU (electrical control unit) 210, and between the battery system 200 and the vehicle ECU 210, communication is possible via a CAN (controller area network). With reference also to FIG. 11, the configuration of the electric vehicle 300 will be described below.

In the electric vehicle 300, the load within the charge/discharge portion 203 is a motor (unillustrated) for propelling the electric vehicle 300. The electric vehicle 300 travels by using as a driving source the output voltage of the voltage source portion 202 of the battery system 200 (specifically, for example, the output voltage of the voltage sources 2[1] to 2[8] in FIG. 7).

Propelling the electric vehicle 300 requires a comparatively high voltage output, and therefore in this embodiment it is assumed that the battery system 200 adopts the configuration described with regard to Embodiment 3. Accordingly, the voltage source portion 202 within the battery system 200 is provided with a plurality of batteries (for example, LIBs) as a plurality of voltage sources. In the following description of this embodiment, simple mentioning of a battery refers to a battery included as a voltage source in the voltage source portion 202.

The charge/discharge control portion 204 in FIG. 11 may be considered to be included in the battery system 200. In Embodiment 5, however, the charge/discharge control portion 204 is considered to be included not in the battery system 200 but in the vehicle ECU 210. As described with regard to Embodiment 4, as the charge/discharge control portion 204 in FIG. 11, the charge/discharge control portion 105 in FIG. 7 may be used.

The vehicle ECU 210 including the charge/discharge control portion 204 receives, from the digital circuit portion 114 in FIG. 7, abnormality information representing the results of detection of the overcharged or overdischarged state of the individual batteries and of detection of whether or not an in-range fault is present, and receives, via the digital circuit portion 114, battery voltage information representing the detected values of the output voltages of the individual batteries according to the AD converter 112. The abnormality information may further include information representing the result of detection of whether or not an out-of-range fault is present. The vehicle ECU 210 has a function as a cruising control portion; it controls the traveling of the electric vehicle 300 by controlling the charging and discharging of the individual batteries based on cruising instructions received from the driver and the just-mentioned abnormality information and battery voltage information.

If any battery is detected to be in the overcharged or overdischarged state, the vehicle ECU 210 stops the charging and discharging of the batteries, and notifies the driver of it by use of a display portion and a speaker mounted on the electric vehicle 300. As a display portion and a speaker mounted on the electric vehicle 300, it is possible to use those of a car navigation system mounted on the electric vehicle 300.

Also if an in-range fault or an out-of-range fault is detected to be present, the vehicle ECU 210 can stop the charging and discharging of the batteries, and can notify the driver of it by use of the display portion and the speaker mentioned above.

Since an in-range fault is a minor fault, however, it is not always best to stop the traveling of the electric vehicle 300 immediately on detection of occurrence of an in-range fault. In view of this, on occurrence of an in-range fault, it is also possible to perform special control as described below.

Special control proceeds as follows. On detecting occurrence of an in-range fault, the vehicle ECU 210 compares the detected voltage values of the output voltages of the batteries based on the output signal of the AD converter 112 with the discriminated voltage values of the output values of the batteries according to the voltage level discrimination portion 113, takes the smaller of each pair of voltage values as the actual output voltage value of the corresponding battery, and permits the charging and discharging of that battery. Such control of charging and discharging is the special control. So long as the charging and discharging of all the batteries are permitted, the electric vehicle 300 can travel by using the output of the batteries. Needless to say, if a voltage value taken as an actual output voltage value is one in the overcharged or overdischarged state, to give priority to safety, the charging and discharging of the batteries are immediately stopped.

On occurrence of an in-range fault, the detected voltage value (for example, 3.0 V) of a battery according to the AD converter 112 may be higher than the actual value (1.9 V). In such a case, permitting the discharging of the battery based on the detected voltage value according to the AD converter 112 causes the overdischarging of the battery to start or progress. It is in view of this that, by use of the smaller of the detected voltage value and the discriminated voltage value, the traveling of the electric vehicle 300 is permitted (in the above example, the discriminated voltage value is expected to be the smaller). If, for discussion's sake, on occurrence of an in-range fault the detected voltage value (for example, 1.9 V) of a battery according to the AD converter 112 is lower than the actual value (3.0 V), the detected voltage value according to the AD converter 112 is the smaller (assuming that no fault is present in the voltage level discrimination portion), and thus overdischarging is prevented from starting or progressing.

Execution of the special control may be permitted without limitation. Since, however, special control is for permitting the traveling of a vehicle under conditions where the battery voltages are not accurately detected, it is preferable to place some limitation to the execution of special control. For example, it is possible to permit the execution of special control only for a predetermined period, or only for a predetermined traveling distance, starting at the moment of detection of an in-range fault.

The electric vehicle 300 may be an electric vehicle that travels by using as a driving source only the batteries within the battery system 200, or may be a hybrid electric vehicles that travels by using as a driving source both the batteries within the battery system 200 and an energy source other than those batteries (for example, fossil fuel). In a case where fuel cells are used as the batteries within the battery system 200, the electric vehicle 300 is also called a fuel-cell vehicle. Although FIG. 12 shows an automobile as the electric vehicle 300, the electric vehicle 300 may be a two-wheeled motor vehicle or any other type of vehicle.

Embodiment 6

A sixth embodiment (Embodiment 6) of the invention will now be described. In Embodiment 6, and also Embodiment 7 described later, the contents of the above-mentioned special control executed on detection of an in-range fault will be described with reference to the relevant drawings. The configuration of the battery system according to Embodiments 6 and 7 is similar to that of the battery system 200 according to Embodiment 4 (see FIG. 11), and therefore the battery system according to Embodiments 6 and 7 will also be identified by the reference sign 200. The electric vehicle 300 in FIG. 12 can be built by use of the battery system 200 according to Embodiments 6 and 7. Although Embodiments 6 and 7 are presented separately from Embodiments 1 to 5, the technology described with regard to Embodiments 6 and 7 can be said to be that already described somewhere above with regard to the previously described embodiments.

Figure 15:
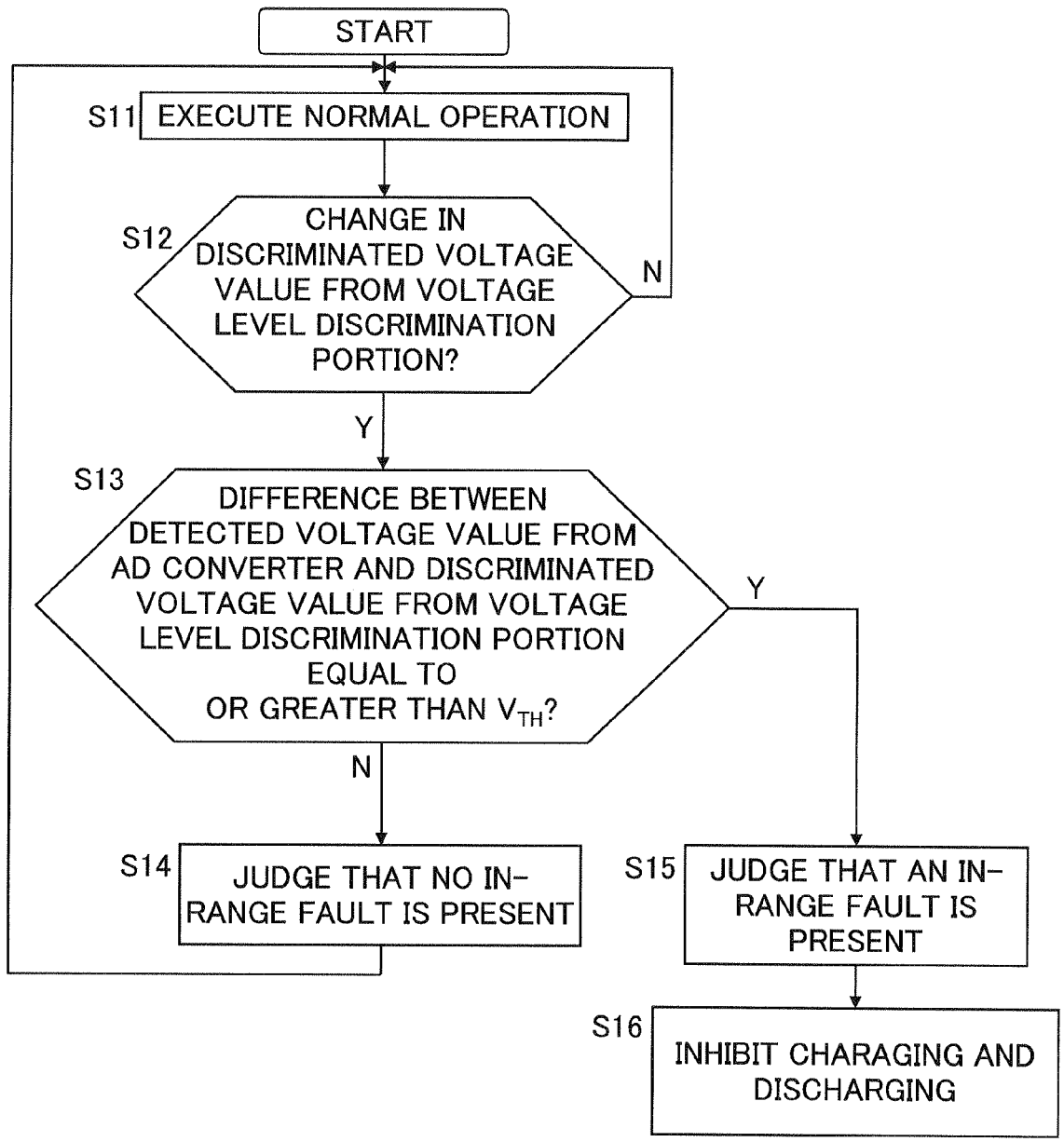
FIG. 15 is an operation flow chart of a battery system according to Embodiment 6 of the invention.
Figure 16:
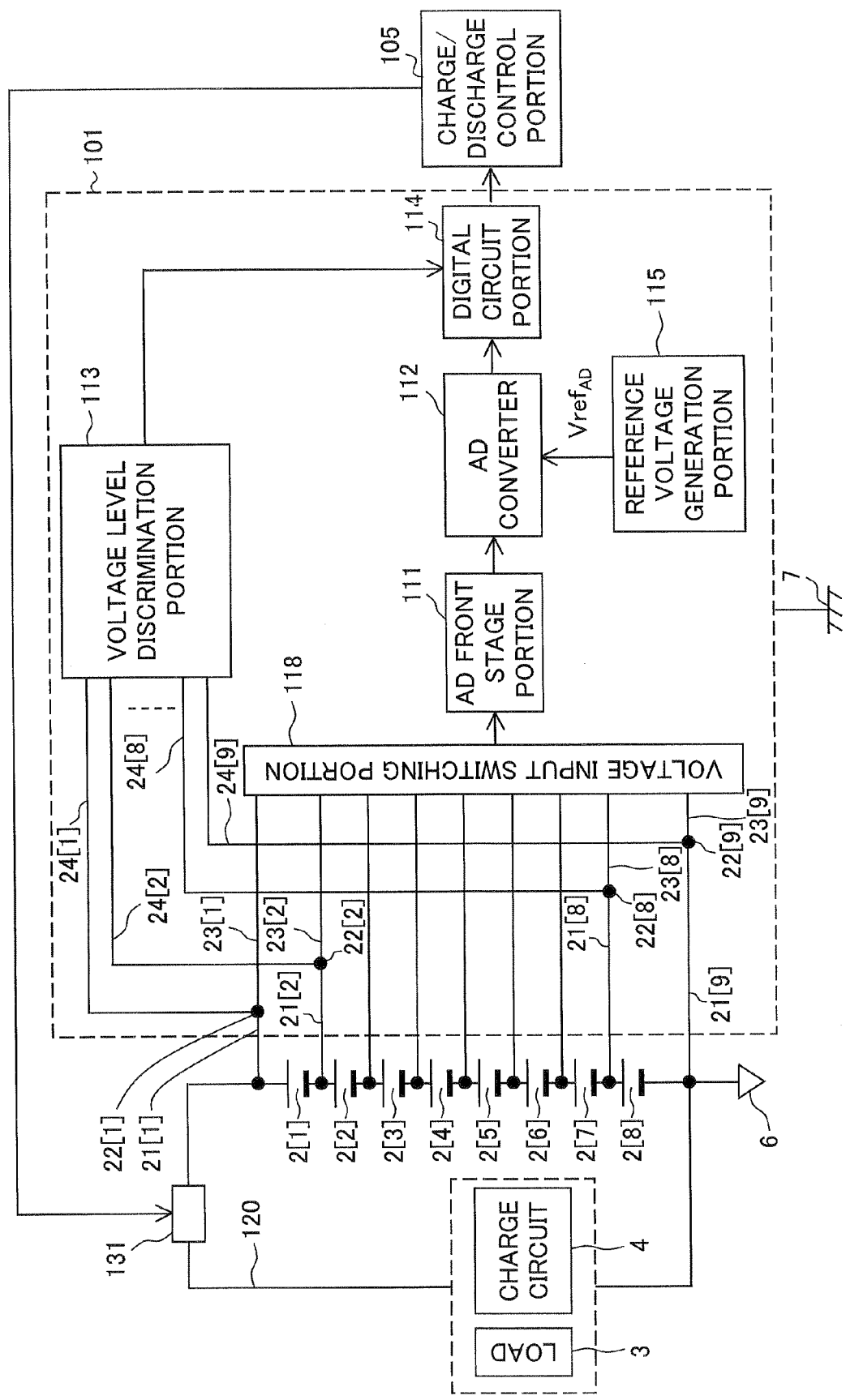
FIG. 16 is a block diagram of a voltage detection apparatus and blocks accompanying it according to Embodiments 6 and 7 of the invention.

FIG. 15 is an operation flow chart of the battery system 200 according to Embodiment 6, with special attention paid to in-range faults. Now, with reference to FIGS. 15 and 16, a description will be given of the operation performed in a case where used as the voltage detection apparatus 201, the voltage source portion 202, the charge/discharge portion 203, and the charge/discharge control portion 204 of the battery system 200 (see FIG. 11) are a voltage detection apparatus 101, a voltage source portion composed of voltage sources 2[1] to 2[8], a charge/discharge portion including a load 3 and a charge circuit 4, and a charge/discharge control portion 105 respectively. FIG. 16 is a block diagram of the voltage detection apparatus and the blocks accompanying it according to Embodiments 6 and 7.

First, at step S11, the battery system 200 executes normal operation. Normal operation denotes operation performed in a state where the charging and discharging of LIBs as the voltage sources 2[1] to 2[8] is permitted. Accordingly, during the execution of normal operation, whenever the charging of the LIBs as the voltage sources 2[1] to 2[8] is necessary, the charging of the voltage sources 2[1] to 2[8] by the charge circuit 4 is effected, and whenever the discharging of the LIBs as the voltage sources 2[1] to 2[8] is necessary, the discharging of the voltage sources 2[1] to 2[8] for the load 3 is effected. As described previously, the charging and discharging of the voltage sources 2[1] to 2[8] are controlled by the charge/discharge control portion 105.

During the execution of normal operation at step S11, the processing at step S12 is performed. At step S12, the digital circuit portion 114 checks whether or not there is a change in the discriminated voltage value VL[j] from the voltage level discrimination portion 113. For example, in a case where, as the voltage level discrimination portion 113, the voltage level discrimination portion 113*a* in FIG. 8 is used, the discriminated voltage value VL[j] is indicated by the output signals of the four comparators within the level discrimination portion **130[*j*]; accordingly, when there is a change in any of the output signals of the comparators within the level discrimination portion 130[*j*]**, it is judged that there is a change in the discriminated voltage value VL[j]. If it is judged that there is no change in the discriminated voltage value VL[j], a return is made to step S11, where the processing at steps S11 and S12 is repeated; if it is judged that there is a change in the discriminated voltage value VL[j], an advance from step S12 to step S13 occurs. Here, it is assumed that, when there is a change in one or more of the discriminated voltage values VL[1] to VL[8], an advance from step S12 to step S13 is effected. For the sake of concrete description, the following description deals with the operation performed when it is judged that there is a change in the discriminated voltage value VL[1]; similar operation is performed when it is judged that there is a change in any of the discriminated voltage values VL[2] to VL[8].

At step S13, the digital circuit portion 114 compares the absolute value of the difference |Vdet[1]−VL[1]| between the detected voltage value Vdet[1] according to the AD converter 112 and the discriminated voltage value VL[1] according to the voltage level discrimination portion 113 with a predetermined fault discrimination threshold value $V_{TH}$. The specific value of the fault discrimination threshold value $V_{TH}$ is arbitrary, and is, for example 0.1 V (volts).

If at step S13 the inequality "|Vdet[1]−VL[1]|≧$V_{TH}$" does not hold, the digital circuit portion 114 judges that no in-range fault is present (step S14), and then a return is made to step S11, where normal operation is continued. By contrast, if at step S13 the above inequality holds, the digital circuit portion 114 judges that an in-range fault is present (step S15), and the charge/discharge control portion 105 performs charging/discharging inhibition processing in step S16. The inequality sign "≧" in the above inequality "|Vdet[1]−VL[1]|≧$V_{TH}$" may be replaced with ">" (the same applies also to Embodiment 7 described later). The charging/discharging inhibition processing by the charge/discharge control portion 105 is processing for inhibiting the discharging of the voltage sources 2[1] to 2[8] for the load 3 and the charging of the voltage sources 2[1] to 2[8] by the charge circuit 4 (in other words, processing for completely limiting the discharging of the voltage sources 2[1] to 2[8] for the load 3 and the charging of the voltage sources 2[1] to 2[8] by the charge circuit 4).

To achieve the charging/discharging inhibition processing by the charge/discharge control portion 105, as shown in FIG. 16, for example, a switch 131 for disconnecting or connecting a main power line 120 is serially inserted in the main power line 120, and the turning on and off of the switch 131 is controlled by the charge/discharge control portion 105. The main power line 120 is loop-shaped wiring by which the circuit having the voltage sources 2[1] to 2[8] connected serially is connected to the load 3 and the charge circuit 4. In normal operation, the switch 131 is kept on so that the main power line 120 remains connected; when the charging/discharging inhibition processing is performed, the switch 131 is turned off by the charge/discharge control portion 105 and the main power line 120 is disconnected; thus, the charging and discharging of the voltage sources 2[1] to 2[8] are inhibited. The switch 131 may be a mechanical switch or a switch employing a semiconductor; adoptable as the switch 131 is, for example, a so-called magnetic contactor.

Depending on the severity of an in-range fault, the characteristics of the voltage sources 2[1] to 2[8], etc., in the charging/discharging inhibition processing, it is possible to inhibit, not both the discharging of the voltage sources 2[1] to 2[8] for the load 3 and the charging of the voltage sources 2[1] to 2[8] by the charge circuit 4, but the charging alone or the discharging alone. Although the above description deals with the operation shown in FIG. 15 as performed in a case where the voltage source portion 202 in FIG. 11 is composed of voltage sources 2[1] to 2[8], a similar description applies in a case where the voltage source portion 202 in FIG. 11 is composed of one voltage source 2 (see FIG. 1 or 5).

According to this embodiment, on detection of occurrence of an in-range fault, simultaneously with or promptly after the detection, the charging of a voltage source is inhibited, or the discharging of a voltage source is inhibited, or the charging and discharging of a voltage source are inhibited. This helps build an extremely safe system.

Embodiment 7

Figure 17:
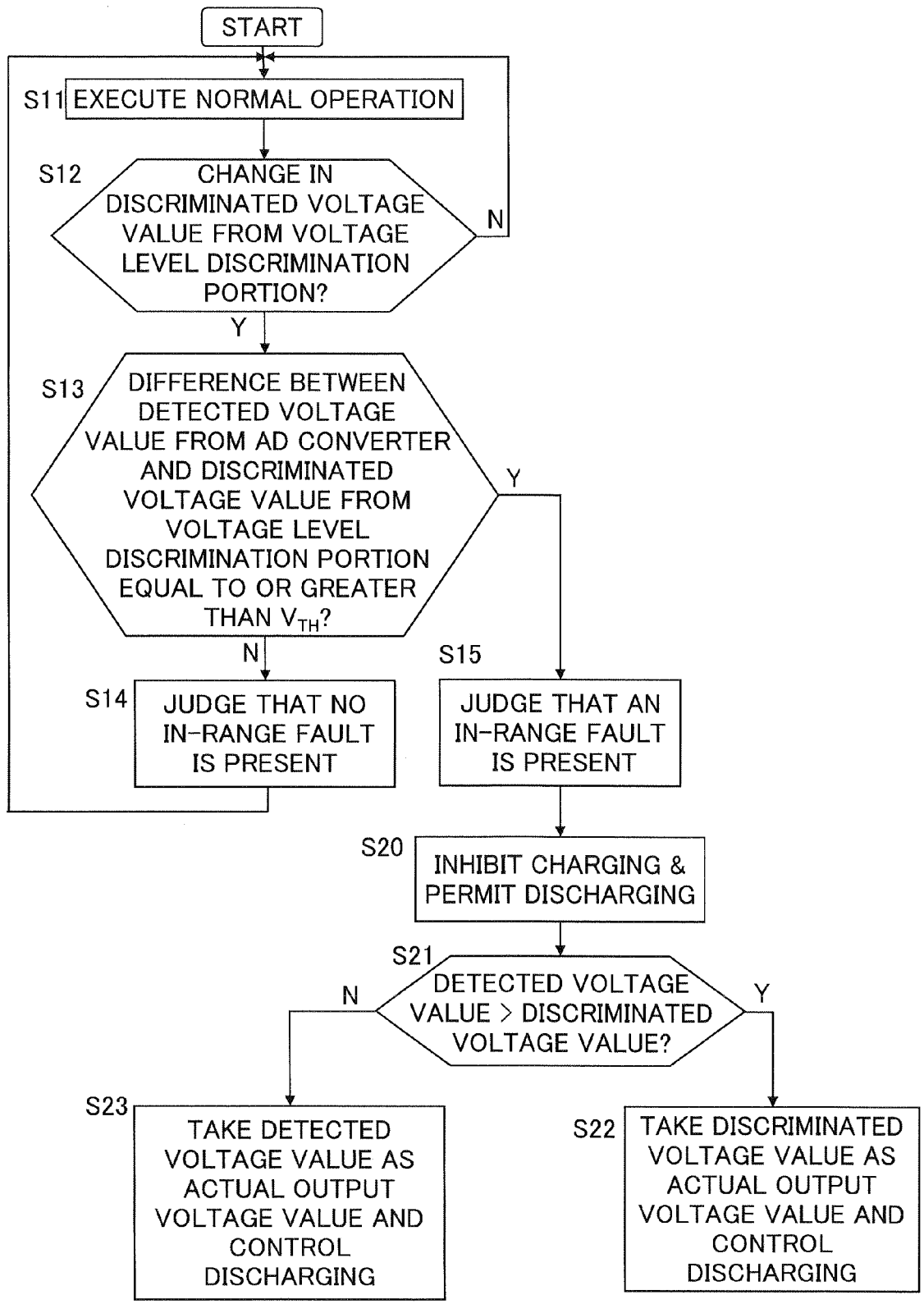
FIG. 17 an operation flow chart of a battery system according to Embodiment 7 of the invention.

A seventh embodiment (Embodiment 7) of the invention will now be described. FIG. 17 is an operation flow chart of the battery system 200 according to Embodiment 7, with special attention paid to in-range faults. Now, with reference to FIGS. 16 and 17, a description will be given of the operation performed in a case where used as the voltage detection apparatus 201, the voltage source portion 202, the charge/discharge portion 203, and the charge/discharge control portion 204 of the battery system 200 (see FIG. 11) are a voltage detection apparatus 101, a voltage source portion composed of voltage sources 2[1] to 2[8], a charge/discharge portion including a load 3 and a charge circuit 4, and a charge/discharge control portion 105 respectively.

The operation flow chart in FIG. 17 includes processing at steps S11 to S15, and this processing is similar to that at steps S11 to S15 in Embodiment 6. Specifically, at step S11, normal operation is executed; if, at step S12, it is judged that there is a change in the discriminated voltage value VL[j] according to the voltage level discrimination portion 113, an advance is made from step S12 to step S13, where the absolute value of the difference |Vdet[j]−VL[j]| between the detected voltage value Vdet[j] according to the AD converter 112 and the discriminated voltage value VL[j] according to the voltage level discrimination portion 113 is compared with a predetermined fault discrimination threshold value $V_{TH}$. As described with regard to Embodiment 6, if it is judged that there is a change in one or more of the discriminated voltage values VL[1] to VL[8], an advance from step S12 to step S13 is effected. For the sake of concrete description, the following description deals with the operation performed when it is judged that there is a change in the discriminated voltage value VL[1]; similar operation is performed when it is judged that there is a change in any of the discriminated voltage values VL[2] to VL[8].

If it is judged that there is a change in the discriminated voltage value VL[1], then at step S13 the absolute value |Vdet[1]−VL[1]| is compared with the fault discrimination threshold value $V_{TH}$. If the inequality "|Vdet[1]−VL[1]|≧$V_{TH}$" does not hold, the digital circuit portion 114 judges that no in-range fault is present (step S14), and then a return is made to step S11, where normal operation is continued. By contrast, if at step S13 the inequality "|Vdet[1]−VL[1]|≧$V_{TH}$" holds, an advance from step S13 to step S15 occurs, and at step S15 the digital circuit portion 114 judges that an in-range fault is present.

In Embodiment 7, if at step S13 the inequality "|Vdet[1]−VL[1]|≧$V_{TH}$" holds, an advance is made from step S13 via step S15 to step S20, so that the processing in steps S20 and S21 is executed one step after the other. On detection of occurrence of an in-range fault, at step S20 the charge/discharge control portion 105 so controls the charge circuit 4 as to inhibit, thereafter until the cause (factor) of the fault is removed, the charging of the voltage sources 2[1] to 2[8] by the charge circuit 4 while permitting the discharging of the voltage sources 2[1] to 2[8] for the load 3 (in a case where, for discussion's sake, charging can be controlled for each voltage source, in step S20, the charging of, out of the voltage sources 2[1] to 2[8], the voltage source 2[1] alone may be inhibited). On the other hand, overdischarging of the voltage sources 2[1] to 2[8] is avoided by executing, via the branching processing at step S21, either the processing at step S22 or step S23.

In the branching processing at step S21, the digital circuit portion 114 or the charge/discharge control portion 105 compares the detected voltage value Vdet[1] according to the AD converter 112 with the discriminated voltage value VL[1] according to the voltage level discrimination portion 113. If the detected voltage value Vdet[1] is greater than the discriminated voltage value VL[1], an advance is made from step S21 to step S22 so that the charge/discharge control portion 105, taking the discriminated voltage value VL[1] as the actual output voltage value $V_{CONT}[1]$ of the voltage source 2[1], performs discharge control of the voltage sources 2[1] to 2[8]. By contrast, if the detected voltage value Vdet[1] is not greater than the discriminated voltage value VL[1], an advance is made from step S21 to step S23 so that the charge/discharge control portion 105, taking the detected voltage value Vdet[1] as the actual output voltage value $V_{CONT}[1]$ of the voltage source 2[1], performs discharge control of the voltage sources 2[1] to 2[8]. For example, when Vdet[1] and VL[1] are 3.6 V and 3.8 V respectively, $V_{CONT}[1]$ is 3.6 V; when Vdet[1] and VL[1] are 4.0 V and 3.8 V respectively, $V_{CONT}[1]$ is 3.8 V (assuming that $V_{TH}$ is 0.2 V or less).

In the discharge control of the voltage sources 2[1] to 2[8] at steps S22 and S23, if the output voltage value $V_{CONT}[1]$ falls below 2 V, which is the lower limit of the normal voltage range, it is judged that the voltage source 2[1] is being overdischarged, and the charge/discharge control portion 105 also inhibits the discharging of the voltage sources 2[1] to 2[8] for the load 3. For example, as described with regard to Embodiment 6, a switch 131 is provided in the main power line 120 (see FIG. 16), and if the output voltage value $V_{CONT}[1]$ falls below 2 V, which is the lower limit of the normal voltage range, the switch 131 is turned off and thereby the main power line 120 is disconnected so that both the discharging and charging of the voltage sources 2[1] to 2[8] are inhibited. Assuming that the detected voltage values Vdet[2] to Vdet[8] of the voltage sources 2[2] to 2[8] do not contain a detection error due to an in-range fault, also if any of the detected voltage values Vdet[2] to Vdet[8] falls below 2 V, the discharging of the voltage sources 2[1] to 2[8] for the load 3 is inhibited likewise.

The processing at steps S21 to S23 corresponds to that executed in the special control described with regard to Embodiment 5. Although the above description deals with the operation shown in FIG. 17 as performed in a case where the voltage source portion 202 in FIG. 11 is composed of voltage sources 2[1] to 2[8], a similar description applies in a case where the voltage source portion 202 in FIG. 11 is composed of one voltage source 2 (see FIG. 1 or 5).

According to this embodiment, on detection of occurrence of an in-range fault, simultaneously with or promptly after the detection, the charging of a voltage source is inhibited. Thus, it is possible to avoid overcharging, which is to be most avoided from the perspective of safety. On the other hand, on detection of occurrence of an in-range fault, instead of immediate inhibition of discharging, discharge control is performed by use of the smaller of a detected voltage value according to the AD converter and a discriminated voltage value according to the voltage level discrimination portion (that is, the voltage value on the safer side). Thus, even on occurrence of an in-range fault, it is possible to extract electric power from a voltage source safely for a while without causing overdischarging to start or progress.

Embodiment 8

An eighth embodiment (Embodiment 8) of the invention will now be described. In the battery system of any of the embodiments described previously, a current restricting device for restricting the passage of a high short-circuit current may be provided in the wiring that connects a voltage source to a voltage detection apparatus.

Figure 18:
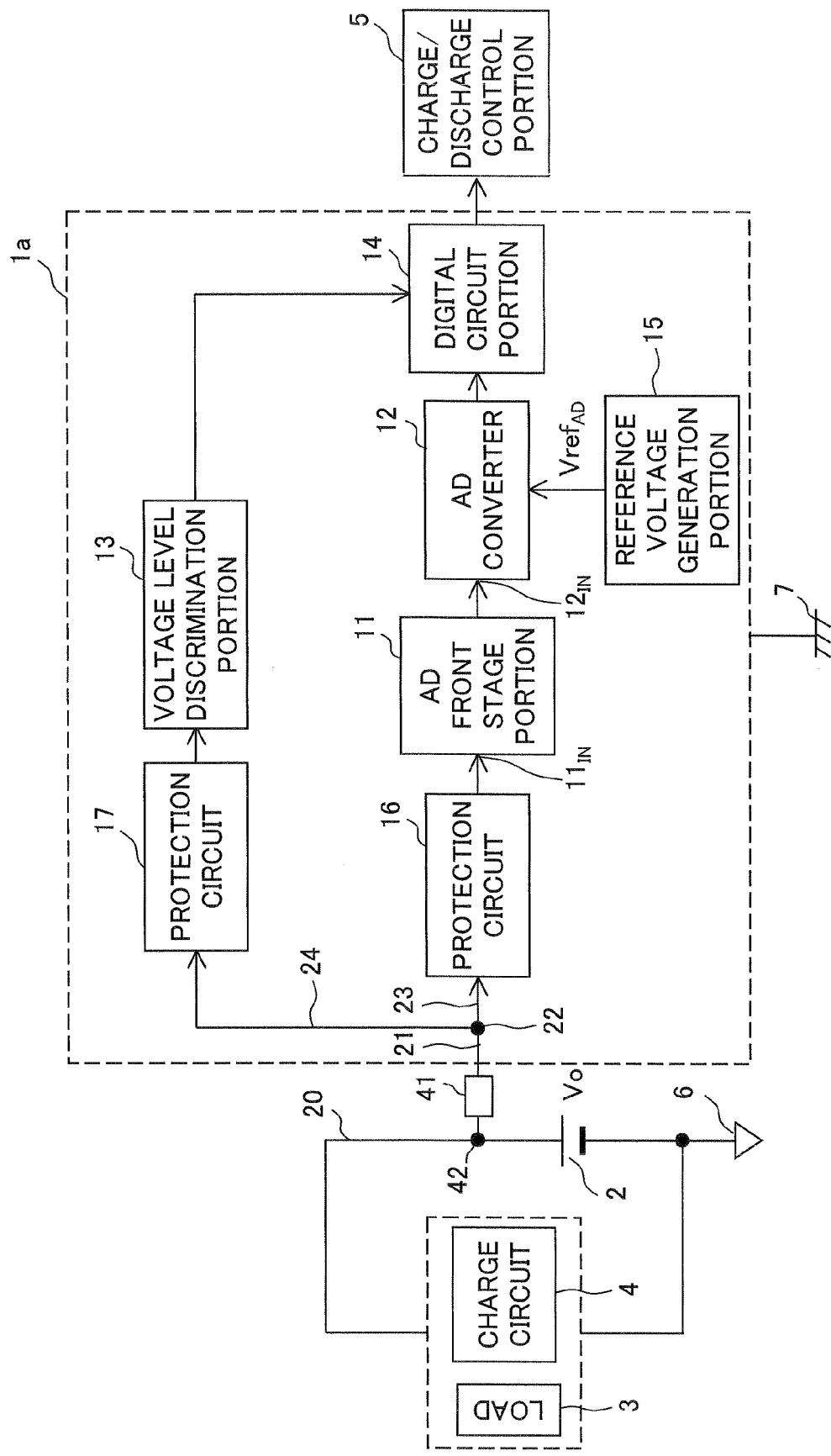
FIG. 18 is a block diagram of a voltage detection apparatus and blocks accompanying it according to Embodiment 8 of the invention.

For example, the configuration in FIG. 5 described with regard to Embodiment 2 may be modified as shown in FIG. 18. Compared with the configuration in FIG. 5, which is composed of a voltage detection apparatus 1a, a voltage source 2, a load 3, a charge circuit 4, and a charge/discharge control portion 5, the configuration in FIG. 18 is additionally provided with a current restricting device 41. Except for this addition, the configuration in FIG. 18 is the same as that in FIG. 5. In FIG. 18, the reference sign 42 identifies an extraction point, which is the point at which the main power line 20 and the voltage detection line 21 are connected together. The current restricting device 41 is provided serially in the wiring that connects between the branch point 22 and the extraction point 42, that is, in the voltage detection line 21. Preferably, the current restricting device 41 is provided as close to the extraction point 42 as possible.

The current restricting device 41 is a resistive element, and restricts the magnitude of the current that tends to pass from the voltage source 2 via the extraction point 42 and the current restricting device 41. For example, if a part of the voltage detection line 21 on the branch point 22 side of the current restricting device 41 is short-circuited to the reference potential point 6, or if the voltage detection lines 23 and 24 are short-circuited to the reference potential point 6, without the current restricting device 41, an extremely high short-circuit current passes across the voltage detection line 21; providing the current restricting device 41 makes it possible to restrict the magnitude of the short-circuit current in such cases.

As the current restricting device 41, a simple resistor (such as a carbon film resistor) may be used. In a case where a simple resistor is used as the current restricting device 41, however, if a high leakage current passes somewhere within the voltage detection apparatus 1a (for example, if the leakage current that passes via the input terminal $11_{IN}$ of the AD front stage portion 11 becomes comparatively high), the leakage current causes an increased voltage drop across the current restricting device 41, degrading the accuracy with which the voltage value of the voltage source 2 is detected, and degrading the accuracy with which in-range faults are detected.

It is therefore preferable to use as the current restricting device 41 a PTC (positive temperature coefficient) thermistor. A PTC thermistor is a resistive element having a comparatively high positive temperature coefficient, and as its temperature rises, its resistance increases. It is particularly preferable to use a PTC thermistor whose resistance remains comparatively low (for example, several Ω) in a normal temperature range (for example, 0° C. to 80° C.) but abruptly increases over a certain temperature. By using such a PTC thermistor as the current restricting device 41, it is possible to obtain a satisfactory effect of restricting current on occurrence of short circuiting, while keeping the resistance low in the steady state to avoid degradation of the detection accuracy of the voltage value of the voltage source 2 and the detection accuracy of in-range faults.

Figure 21:
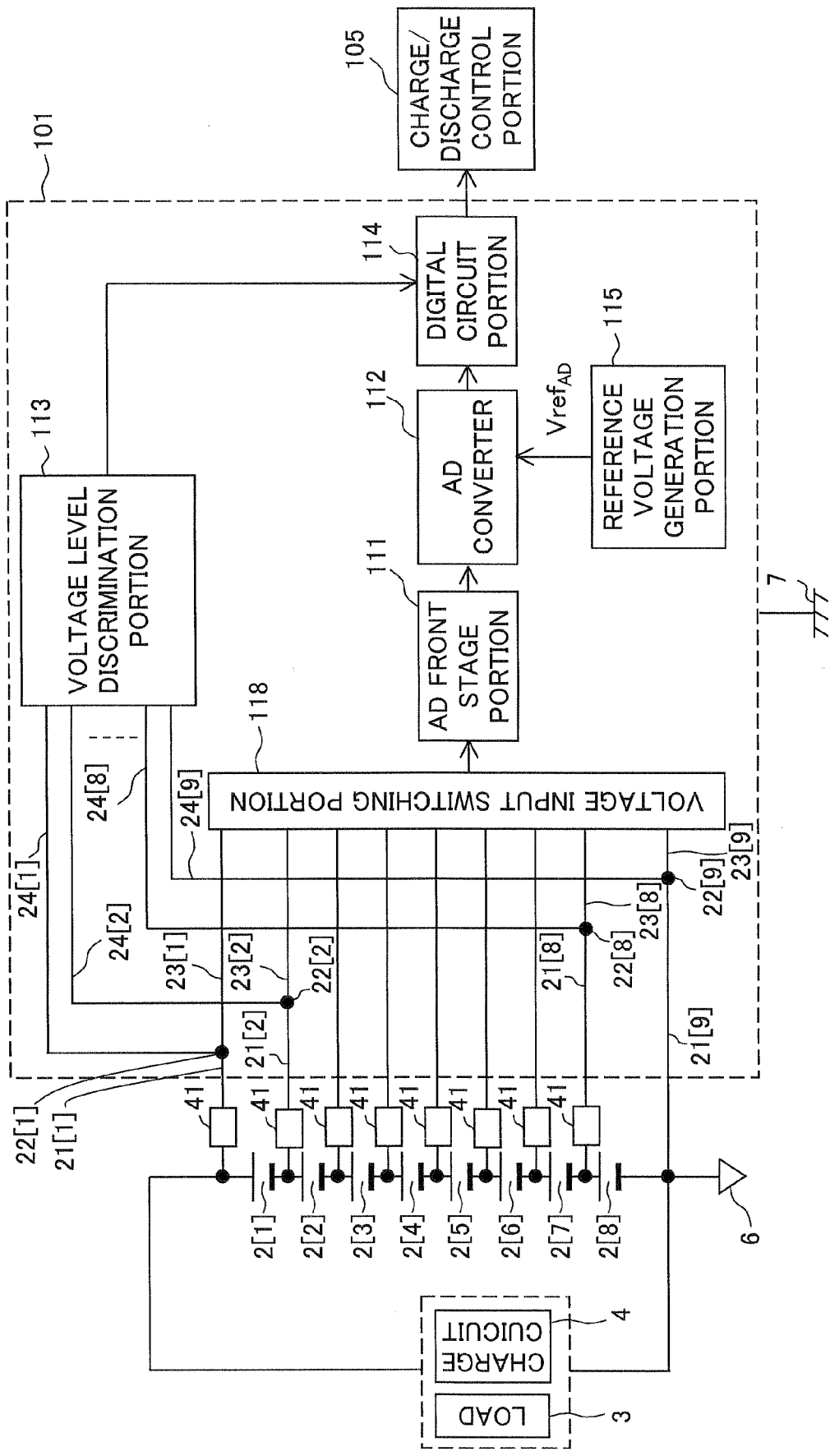
FIG. 21 is a diagram showing a modified example of a configuration according to Embodiment 8 of the invention.

Although the above description deals with a configuration in which the current restricting device 41 is provided in the voltage detection line 21 with reference to FIG. 18, the current restricting device 41 may likewise be provided serially in the voltage detection line 21 in FIG. 1. Likewise, the current restricting device 41 may be provided serially in each of the voltage detection lines 21[1] to 21[8] in FIG. 7 (see FIG. 21) or FIG. 16.

Modifications and Variations

The specific values given above in the description of the embodiments are merely examples, which, needless to say, may be modified to any other values.

Figure 19:
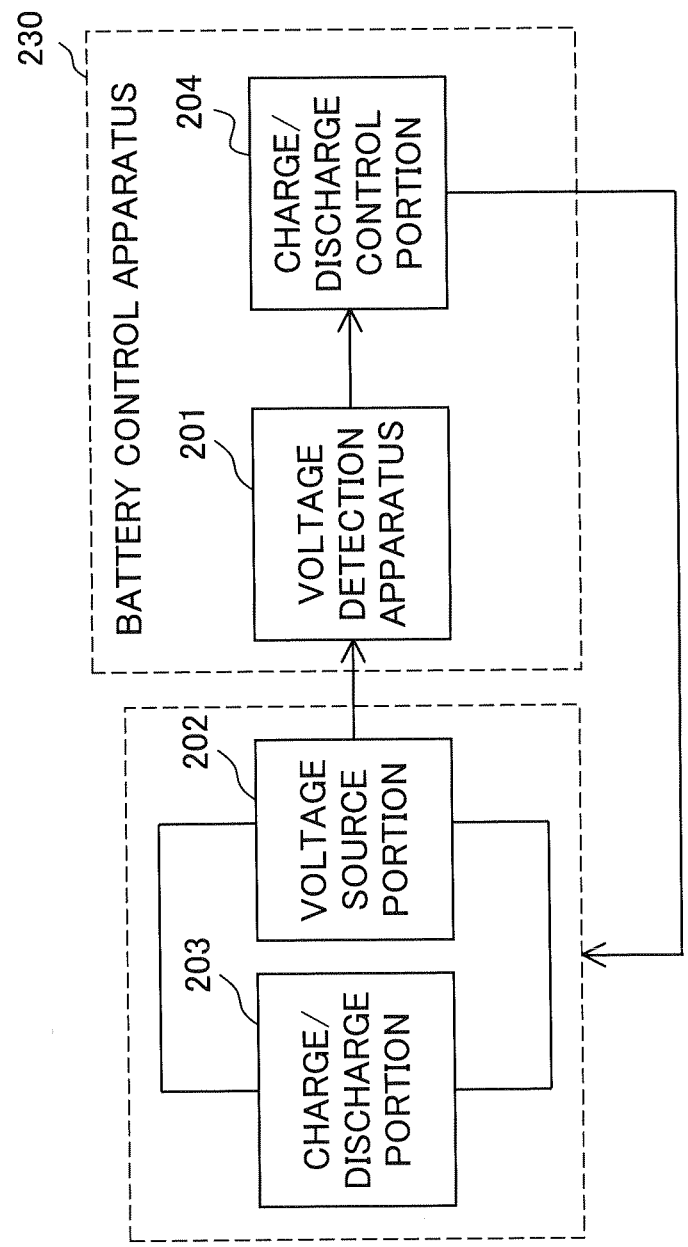
FIG. 19 is a diagram showing how a battery control apparatus is inherent in a configuration according to the invention.

As shown in FIG. 19, the apparatus composed of the voltage detection apparatus 201 and the charge/discharge control portion 204 may be considered to be a battery control apparatus 230. The voltage detection apparatus 201 and the charge/discharge control portion 204 may be formed in separate integrated circuits, or may be formed in a single integrated circuit. That is, the battery control apparatus 230 may be formed as integrated circuits on two chips, or may be formed as an integrated circuit on a single chip.

The switch 131 in FIG. 16 may be replaced with a current limiter so that in the charging/discharging inhibition processing according to Embodiment 6 (see FIG. 15), by controlling the resistance value of the current limiter, the charging and discharging of the voltage sources 2[1] to 2[8] are limited. The current limiter is controlled by the charge/discharge control portion 105 to be either in a low-resistance state or a high-resistance state. The resistance value of the current limiter in the high-resistance state (for example, several kΩ) is far higher than its resistance value in the low-resistance state (for example, 1Ω or less). Preferably, the charge/discharge control portion 105 controls the resistance value of the current limiter in such a way that the current limiter is in the low-resistance state during normal operation but goes into the high-resistance state when the charging/discharging inhibition processing is executed. In this way, the current value of the discharging and charging of the voltage sources 2[1] to 2[8] is limited more when the charging/discharging inhibition processing is executed than during normal operation.

Figure 20:
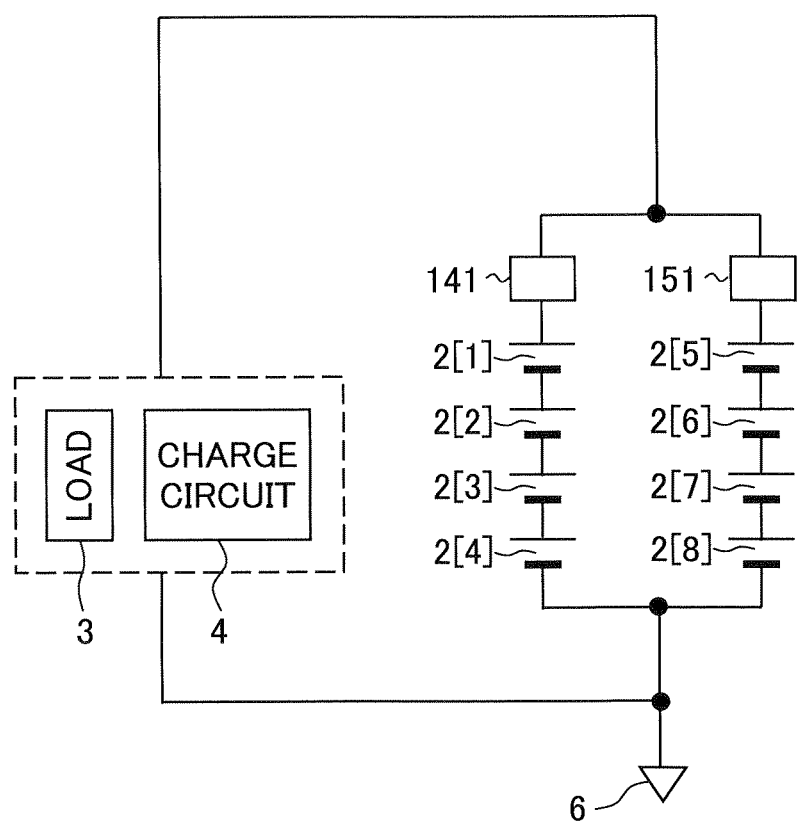
FIG. 20 is a diagram showing a modified example of interconnection among a plurality of voltage sources, a load, and a charge circuit.

In a case where the plurality of voltage sources included in the voltage source portion 202 (see FIG. 11) are arranged parallel, in Embodiment 6, it is also possible to perform charging/discharging inhibition processing as follows. For example, consider a case (see FIG. 20) where the voltage source portion 202 is built by parallel connecting two serial circuits, one having voltage sources 2[1] to 2[4] connected serially and the other having voltage sources 2[5] to 2[8] connected serially. In this case, as shown in FIG. 20, a device 141 is further connected serially in the serial circuit of the voltage sources 2[1] to 2[4], and a device 151 is further connected serially in the serial circuit of the voltage sources 2[5] to 2[8]. Then, the serial circuit of the voltage sources 2[1] to 2[4] and the device 141 and the serial circuit of the voltage sources 2[5] to 2[8] and the device 151 are connected parallel, and the resulting circuit is connected to the load 3 and the charge circuit 4. The devices 141 and 151 are each a switch like the switch 131 or a current limiter as mentioned above. Although the foregoing deals with an example in which the number of serial circuits (each a serial circuit of voltage sources) that are connected parallel is two, the number is not limited to two.

In a case where the devices 141 and 151 are switches, during normal operation, the charge/discharge control portion 105 keeps the devices 141 and 151 on, permitting the discharging and charging of the voltage sources 2[1] to 2[8]; by contrast, when the charging/discharging inhibition processing is executed, depending on the cause (factor) of an in-range fault, the charge/discharge control portion 105 turns at least one of the devices 141 and 151 off. Specifically, for example, if at step S13 the inequality "|Vdet[1]−VL[1]|≧$V_{TH}$" holds and an advance to step S15 occurs, an in-range fault is considered to be present in the voltage detection with respect to the voltage source 2[1]; accordingly, in the charging/discharging inhibition processing at step S16, while the device 151 is kept on, the device 141 alone is turned off. In this way, the discharging and charging of, out of the voltage sources 2[1] to 2[8], the voltage sources 2[1] to 2[4] alone is inhibited.

In a case where the devices 141 and 151 are current limiters, the charge/discharge control portion 105 controls the resistance values of the devices 141 and 151 individually. During normal operation, the charge/discharge control portion 105 controls the devices 141 and 151 so that the current limiters, which they are, both remain in the low-resistance state. For example, if at step S13 the inequality "|Vdet[1]−VL[1]|≧$V_{TH}$" holds and an advance to step S15 occurs, an in-range fault is considered to be present in the voltage detection with respect to the voltage source 2[1]; accordingly, in the charging/discharging inhibition processing at step S16, preferably, the charge/discharge control portion 105 controls the devices 141 and 151 so that the current limiter as the device 141 goes into the high-resistance state while the current limier as the device 151 remains in the low-resistance state. Irrespective of whether the devices 141 and 151 are switches or current limiters, when the charging/discharging inhibition processing is performed, the overall current value of the discharging and charging of the voltage sources 2[1] to 2[8] is limited more than during normal operation.

In FIGS. 1, 5, and 18, the circuit portion provided between the branch point 22 and the AD converter 12 can be grasped as one additional circuit portion. Likewise, in FIGS. 7 and 16, the circuit portion provided between the branch points 22[1] to 22[9] and the AD converter 112 can be grasped as one additional circuit portion.

What is claimed is:

1. A battery system comprising:
 a voltage detection apparatus including
  a voltage detection portion which includes an AD converter which converts an analog voltage signal having a measurement target analog voltage into a digital voltage signal to output the digital voltage signal,
  a voltage level discrimination portion which is connected to a voltage detection line across which the analog voltage signal is delivered, and which discriminates a voltage level of the measurement target analog voltage to output a discrimination result, and
  a fault detection portion which detects, based on an output of the AD converter and an output of the voltage level discrimination portion, a fault in the voltage detection portion in a state in which a voltage value of the digital voltage signal is within a predetermined voltage range;
 a battery as a voltage source of the measurement target analog voltage; and
 a control portion which, when the fault detection portion detects the fault, limits discharging of the battery, or limits charging of the battery, or limits discharging and charging of the battery
wherein
the voltage level discrimination portion includes comparators which compare the measurement target analog voltage with predetermined reference voltages within the predetermined voltage range, and
to detect the fault in the voltage detection portion in the state in which the voltage value of the digital voltage signal is within the predetermined voltage range, the fault detection portion compares the output of the AD converter and the output of the voltage level discrimination portion at a moment that an output of the comparators changes.

2. The battery system according to claim 1, wherein
the battery is a chargeable and dischargeable battery, and
when the fault detection portion detects the fault, the control portion inhibits charging of the battery but permits discharging of the battery.

3. The battery system according to claim 2, wherein
when the fault detection portion detects the fault, the control portion controls discharging of the battery by using, as an output voltage value of the battery, a smaller of a voltage value based on the output of the AD converter and a voltage value based on the output of the voltage level discrimination portion.

4. The battery system according to claim 1, wherein
a branch point from which the analog voltage signal is fed separately to the AD converter and to the voltage level discrimination portion is provided on the voltage detection line,
the voltage detection portion includes an additional circuit portion provided between the branch point and the AD converter, and
a target of fault detection by the fault detection portion includes not only the AD converter but also the additional circuit portion.

5. The battery system according to claim 1, wherein
the measurement target analog voltage comprises a plurality of measurement target analog voltages,
the voltage detection portion further includes a voltage input switching portion which feeds the AD converter with one at a time of a plurality of analog voltage signals representing the plurality of measurement target analog voltages respectively,
the AD converter converts the analog voltage signals fed sequentially from the voltage input switching portion into digital voltage signals to output the digital voltage signals,
the voltage level discrimination portion is connected to a plurality of voltage detection lines across which the plurality of analog voltage signals are delivered, and discriminates voltage levels of the corresponding measurement target analog voltages within the predetermined voltage range to output discrimination results, and
the fault detection portion detects, based on an output of the AD converter and an output of the voltage level discrimination portion, a fault in the voltage detection portion in a state in which voltage values of the digital voltage signals are within the predetermined voltage range.

6. The battery system according to claim 5, wherein
the comparators compare the measurement target analog voltages with predetermined reference voltages within the predetermined voltage range, and
to detect the fault in the voltage detection portion in the state in which the voltage values of the digital voltage signals are within the predetermined voltage range, the fault detection portion compares the output of the AD converter and the output of the voltage level discrimination portion at the moment that the output of the comparators changes.

7. The battery system according to claim 5, wherein
branch points from which the plurality of analog voltage signals are respectively fed separately to the AD converter and to the voltage level discrimination portion are provided on the voltage detection lines,
the voltage detection portion includes an additional circuit portion provided between the branch points and the AD converter,
the voltage input switching portion is included in the additional circuit portion, and
a target of fault detection by the fault detection portion includes not only the AD converter but also the additional circuit portion.

8. The battery system according to claim 1, wherein
a branch point from which the analog voltage signal is fed separately to the AD converter and to the voltage level discrimination portion is provided on the voltage detection line, and
a current restricting device which restricts current flow across wiring between the battery and the branch point is provided in the wiring.

9. The battery system according to claim 5, wherein
branch points from which the plurality of analog voltage signals are respectively fed separately to the AD converter and to the voltage level discrimination portion are provided on the voltage detection lines, and
current restricting devices which, one for each of a plurality of batteries as voltage sources of the plurality of measurement target analog voltages, restrict current flow across wiring between the batteries and the branch points are provided in the wiring.

10. An electric vehicle which comprises the battery system according to claim 1 and which travels by using the battery in the battery system as a driving source.

11. The electric vehicle according to claim 10, further comprising:
a cruising control portion which controls traveling of the electric vehicle by use of the voltage detection apparatus within the battery system, wherein
when the fault detection portion within the battery system detects the fault in the voltage detection portion, the cruising control portion controls traveling of the electric vehicle by using, as an output voltage value of the battery, a smaller of a voltage value based on the output of the AD converter and a voltage value based on the output of the voltage level discrimination portion.

* * * * *